United States Patent
Toda et al.

(10) Patent No.: US 6,503,800 B2
(45) Date of Patent: Jan. 7, 2003

(54) MANUFACTURING METHOD OF SEMICONDUCTOR DEVICE HAVING DIFFERENT GATE OXIDE THICKNESS

(75) Inventors: Takeshi Toda, Tokyo (JP); Yoshiro Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 11 days.

(21) Appl. No.: 09/881,945

(22) Filed: Jun. 15, 2001

(65) Prior Publication Data

US 2001/0053579 A1 Dec. 20, 2001

(30) Foreign Application Priority Data

Jun. 19, 2000 (JP) ......................................... 2000-182574

(51) Int. Cl.[7] ............................................. H01L 21/336
(52) U.S. Cl. ....................... 438/279; 438/275; 438/201; 438/258; 438/981
(58) Field of Search ................................. 438/981, 201, 438/258, 261, 275, 279, 587

(56) References Cited

U.S. PATENT DOCUMENTS

| | | | | |
|---|---|---|---|---|
| 5,861,347 A | * | 1/1999 | Maiti et al. ................. | 438/787 |
| 6,033,958 A | * | 3/2000 | Chou et al. ................. | 438/275 |
| 6,037,222 A | * | 3/2000 | Huang et al. ............... | 438/257 |
| 6,265,267 B1 | * | 7/2001 | Huang et al. ............... | 438/258 |

FOREIGN PATENT DOCUMENTS

JP          02-129968          5/1990

* cited by examiner

Primary Examiner—Chandra Chaudhari
Assistant Examiner—Jack Chen
(74) Attorney, Agent, or Firm—Katten Muchin Zavis Rosenman

(57) ABSTRACT

The present invention provides a manufacturing method of a semiconductor device having a single semiconductor substrate, for forming a first processing circuit portion and a second processing circuit portion having mutually different thicknesses of gate oxide films on the single semiconductor substrate including the steps of: forming a first gate oxide film over the semiconductor substrate; sequentially forming an insulating film and a first conducting layer over the entire surface of the first gate oxide film; eliminating those portions ranging from the first gate oxide film to the first conducting layer, which portions are included within an element forming region of the first processing circuit portion; and forming, only in the element forming region of the first processing circuit portion, a second gate oxide film having a thickness different from that of the first gate oxide film.

5 Claims, 27 Drawing Sheets

MANUFACTURING METHOD OF SEMICONDUCTOR DEVICE HAVING DIFFERENT GATE OXIDE THICKNESS

BACKGROUND OF THE INVENTION

1. Field of the Invention

The present invention relates to a manufacturing method of a semiconductor device, and more particularly to a manufacturing method of a semiconductor device, for limiting: the film thicknesses of gate thermal oxide films of a plurality of processing circuit portions comprising MOS-transistors; and the film-thickness-difference variation among gate thermal oxide films of the processing circuits comprising the MOS-transistors; within desired ranges without deteriorating the performance of the MOS-transistors.

2. Description of the Prior Art

Those semiconductor devices such as represented by LSI's and VLSI's have been developed year by year, concerning increased density, increased integration, enhanced function, and increased processing speed. Achieving increased density of semiconductor devices requires precise structures thereof. Further, achieving increased integration and higher function requires that: (i) different kinds of devices (or circuits) such as processing devices and (ii) semiconductor memory devices (such as non-volatile memory devices), which have been inherently manufactured independently, are to be brought into semiconductor devices collectively mounted on a single plate of semiconductor substrate. Moreover, achieving an increased processing speed requires to reduce the thickness of gate thermal oxide films of MOS-transistors (MOSFET's).

However, excessively reduced thickness of gate thermal oxide films causes such a phenomenon that electric current (gate leak electric current) flows from a gate electrode to a source electrode or from a gate electrode to a sub-electrode. This phenomenon causes increased power consumption.

Such as in mobile telephones (portable telephones, PHS's) and household electric appliances, those semiconductor devices to be adopted are required to have such characteristics: to execute faster arithmetic processing in operation; and to have reduced power consumption on stand-by. Since the faster arithmetic processing means or requires increased power consumption, there are required conflicting performances for a single semiconductor device.

FIG. 25 shows a semiconductor device having a structure coping with the conflicting requirements in operation and on stand-by.

Reference numeral 100 designates a semiconductor device constituted of a first processing circuit portion Q1 which operates or works in operation, a second processing circuit portion Q2 which operates on stand-by, and other circuit portion Q3. The first processing circuit portion Q1 has a thinned gate thermal oxide film for enabling a high-speed processing calculation, and the second processing circuit portion Q2 has a thickened gate thermal oxide film for reduced power consumption. For example, both of the gate thermal oxide films of the first processing circuit portion Q1 and second processing circuit portion Q2 are to be preferably deposited to exceed 10 angstroms, at a precision of several angstroms relative to a desired value, and without variance.

Japanese Patent Application Laid-Open No. HEI-2-129968 (129968/1990) discloses a method for implementing those circuit portions within a single semiconductor device which are driven by a plurality of types of power supply voltages, and for differently forming the thicknesses of the gate thermal oxide films of such circuit portions. This manufacturing method shall be detailed hereinafter.

FIGS. 26 through 36 show a conventional manufacturing method of semiconductor devices.

As firstly shown in FIG. 26, there are formed: element-separating insulation films 102 on a one-conductive type of semiconductor substrate 101; a p-type well region 103 in a semiconductor element forming region (hereinafter called "element forming region") of a first processing circuit portion Q1n; a p-type well region 104 in an element forming region of a second processing circuit portion Q2n; and a p-type well region 105 of a non-volatile memory circuit portion (hereinafter called "memory circuit portion") Qm.

Next, as shown in FIG. 27, there is grown a first gate thermal oxide film 106 so as to have a thickness of 50 angstroms to 100 angstroms over the whole surface of the semiconductor substrate 101, and then there is formed a first conducting layer 107 over the whole surface of the semiconductor substrate 101 including the first gate thermal oxide film 106. The first conducting layer 107 can be formed such as by growing a polycrystalline silicon film deposited by a CVD (Chemical Vapor Deposition) method. Next, as shown in FIG. 28, the first conducting layer 107 is patterned into a predetermined shape of first conducting layer 107a. This first conducting layer 107a is left in the element forming region of the memory circuit portion Qm only.

Next, as shown in FIG. 28, there is grown an insulating film 108 over the respective surfaces of the first gate thermal oxide film 106 and first conducting layer 107a. This insulating film 108 has a three-layer structure comprising an oxide film, a nitride film and another oxide film such as deposited by a CVD method, and generally called "ONO film".

Next, as shown in FIG. 30, the first gate thermal oxide film 106 and insulating film 108 are patterned into predetermined shapes of first gate thermal oxide film 106a and insulating film 108a, respectively. The first gate thermal oxide film 106a and insulating film 108a are formed to leave the element forming region of the memory circuit portion Qm. At this time, the shape of the first conducting layer 107a is unchanged, since it is covered by the insulating, film 108a.

Next, as shown in FIG. 31, there is provided a second gate thermal oxide film 109 over the whole surfaces of the element forming regions of the first processing circuit portion Q1n and second processing circuit portion Q2n. This second gate thermal oxide film 109 is rendered to grow into a thickness of 15 to 20 angstroms in the element forming regions. At this time, no second gate thermal oxide films 109 are formed on the insulating film 108a of the memory circuit portion Qm, because of the nature of the ONO film.

Next, as shown in FIG. 32, the second gate thermal oxide film 109 is patterned into a predetermined shape 109a. This second gate thermal oxide film 109a is left in the element forming region of the second processing circuit portion Q2n only.

Next, as shown in FIG. 33, there is grown a third gate thermal oxide film 110 over the element forming regions of the first processing circuit portion Q1n and second processing circuit portion Q2n, such that the third gate thermal oxide film 110 has a thickness between 15 angstroms exclusive to 22 angstroms inclusive in the element forming region of the first processing circuit portion Q1n. At this time, no third gate thermal oxide films are formed on the insulating film 108a of the memory circuit portion Qm because of the nature of the ONO film, whereas the second gate thermal oxide film 109a in the second processing circuit portion Q2n is further deposited so that the thickness exceeds 25 angstroms and reaches 32 angstroms. Further, the shape of the second gate thermal oxide film 109a is also integrated with the third gate thermal oxide film. Thus, the thermal oxide film in the second processing circuit portion Q2n shall be called a "third gate thermal oxide film 110a".

Next, as shown in FIG. 34, there is formed a second conducting layer 111 over the third gate thermal oxide film 110, third gate thermal oxide film 110a and insulating film 108a. The second conducting layer 111 is formed in the same manner as the first conducting layer 107, such as by growing a polycrystalline silicon film deposited by a CVD (Chemical Vapor Deposition) method.

Next, as shown in FIG. 35, the first gate thermal oxide film 106a, first conducting layer 107a, insulating film 108a, third gate thermal oxide film 110 and third gate thermal oxide film 110a are patterned into predetermined shapes of first gate thermal oxide film 106e, first conducting layer 107e, insulating film 108e, third gate thermal oxide film 110c and third gate thermal oxide film 110d, respectively. Further, the second conducting layer 111 is patterned into predetermined shapes of second conducting layers 111c, 111d, 111e.

In the above, the third gate thermal oxide film 110c and second conducting layer 111c are provided to form a gate thermal oxide film and a gate electrode of the first processing circuit portion Q1n, while the third gate thermal oxide film 110d and second conducting layer 111d are provided to form a gate thermal oxide film and a gate electrode of the second processing circuit portion Q2n. Further, the first gate thermal oxide film 106e, first conducting layer 107e, insulating film 108e and second conducting layer 111e are provided to form, in the memory circuit portion Qm: a gate thermal oxide film; a lower gate electrode; an insulating film for separating the lower gate electrode and an upper gate electrode of the memory circuit portion Qm; and the upper gate electrode, respectively.

Next, as shown in FIG. 36, there are formed side walls 112 at the respective side surfaces of the first gate thermal oxide film 106e, first conducting layer 107e, insulating film 108e, third gate thermal oxide film 110c, third gate thermal oxide film 110d, second conducting layer 111c, second conducting layer 111d and second conducting layer 111e. The side walls 112 are formed such as by growing an insulating film comprising a silicon oxide film or silicon nitride film by a CVD method, and by conducting anisotropic etching by a RIE (reactive ion etching) method. Further, there is formed a drain region 114, by introducing n-type impurities into the first processing circuit portion Q1n. It is possible to adopt arsenic as the n-type impurities, for example. Further, there are formed a source region 115 and a drain region 116, by introducing n-type impurities into the second processing circuit portion Q2n. Similarly, there are formed a source region 117 and a drain region 118, by introducing n-type impurities into the memory circuit portion Qm. Based on the above, there are formed gate thermal oxide films of different thicknesses in the respective circuit portions, and the memory circuit portion Qm is formed with a plurality of conducting layers in a multi-layered manner.

According to the aforementioned conventional semiconductor devices and the manufacturing method therefore, it is possible to bring the gate thermal oxide film of the first processing circuit portion Q1n and the gate thermal oxide film of the second processing circuit portion Q2n, into thicknesses greater than 10 angstroms and 20 angstroms, respectively. However, conducting mass-production at the setting of 10 angstroms to 20 angstroms tends to cause variance of thickness in the gate thermal oxide films, and makes it difficult to reach a thickness difference of 10 angstroms or less between the two processing circuit blocks.

This is because the thicknesses of the gate thermal oxide films are evenly increased as shown in FIG. 33 in which the second processing circuit portion Q2n is additionally formed with the gate thermal oxide film while the first processing circuit portion Q1n is formed with the gate thermal oxide film.

In this case, it becomes possible to render the intended thickness difference between the second processing circuit portion Q2n and first processing circuit portion Q1n to be limited to 10 angstroms or less, if the second gate thermal oxide film is grown into a thickness of 10 angstroms or less. However, it is difficult to allow a gate thermal oxide film to uniformly grow into a thickness of 10 angstroms or less, including industrial manufacturing errors. Concretely, growing a gate thermal oxide film into a thickness of 10 angstroms or less causes errors of thickness (thickness errors) on the order of ±3 angstroms, thereby resulting in an increased error relative to an expected value. These thickness errors cause variance among semiconductor elements, thereby resulting in considerably deteriorated performance of MOS-transistors.

BRIEF SUMMARY OF THE INVENTION

Objects of the Invention

It is therefore an object of the present invention to provide a semiconductor device and a manufacturing method therefore capable of forming various thicknesses of gate oxide films at desired values, without deteriorating the performance of MOS-transistors.

Summary of the Invention

The present invention provides a manufacturing method of a semiconductor device having a single semiconductor substrate, for forming a first processing circuit portion and a second processing circuit portion having mutually different thicknesses of gate oxide films on the single semiconductor substrate including the steps of: forming a first gate oxide film over the semiconductor substrate; sequentially forming an insulating film and a first conducting layer over the entire surface of the first gate oxide film; eliminating those portions ranging from the first gate oxide film to the first conducting layer, which portions are included within an element forming region of the first processing circuit portion; and forming, only in the element forming region of the first processing circuit portion, a second gate oxide film having a thickness different from that of the first gate oxide film.

The above-mentioned and other objects, features and advantages of this invention will become more apparent by reference to the following detailed description of the invention taken in conjunction with the accompanying drawings, wherein:

FIG. 25 is a plan view showing a semiconductor device having a structure coping with the conflicting requirements in operation and on stand-by;

DETAILED DESCRIPTION OF THE INVENTION

There will be described hereinafter the embodiments of the present invention, with reference to the accompanying drawings.

Figure 1:
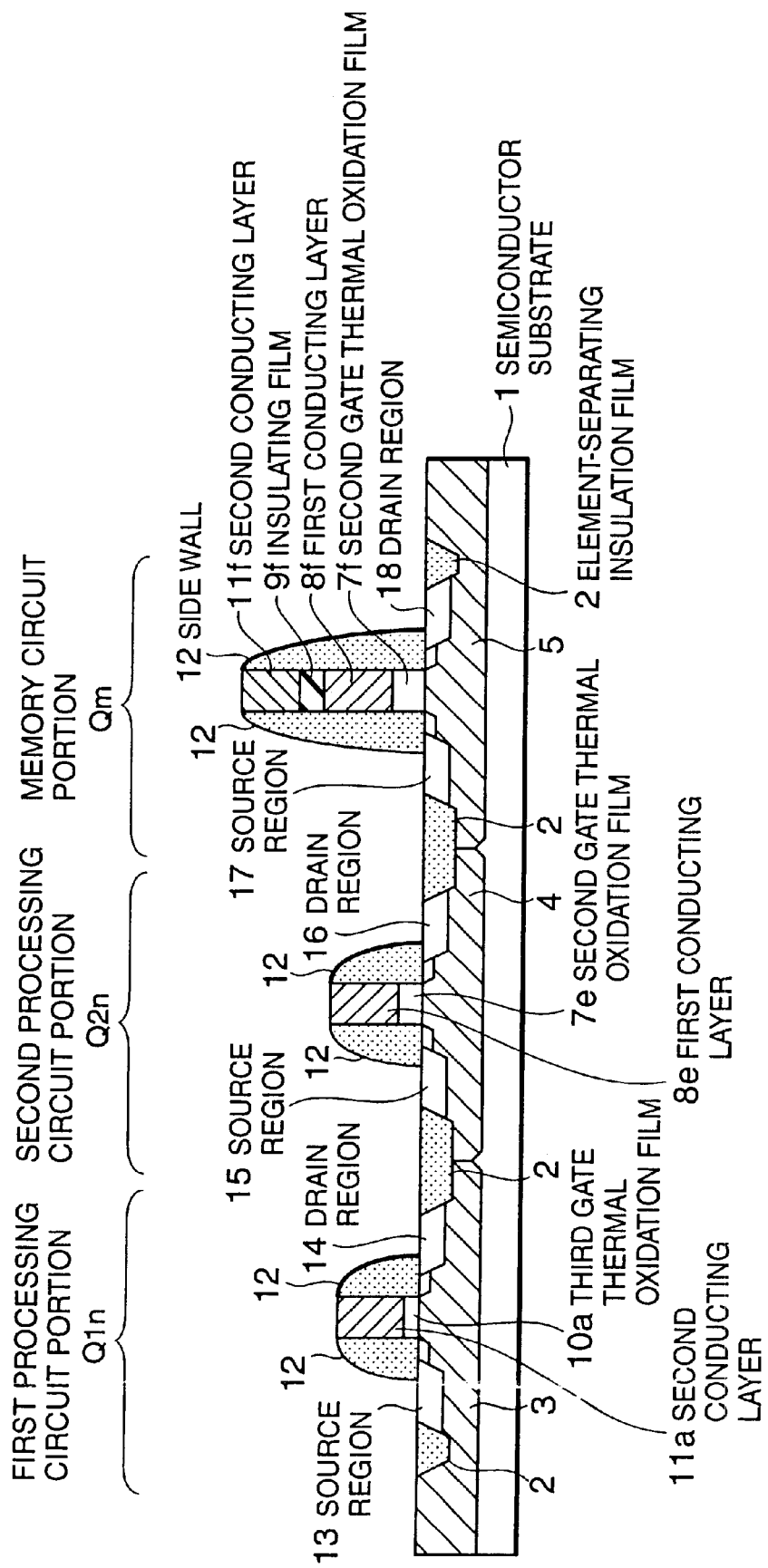
FIG. 1 is a cross-sectional view showing a semiconductor device formed by the present invention.

FIG. 1 shows a semiconductor device according to the present invention. This semiconductor device is provided with a structure having both of processing circuit portions and non-volatile semiconductor memory portion.

Reference numeral 1 designates a semiconductor substrate formed thereon with p-type well regions 3, 4, 5, and provided with element-separating insulation films 2 at predetermined positions. Formed at the peripheries of the element-separating insulation films 2 are source regions 13, 15, 17 and drain regions 14, 16, 18, respectively. Provided at the surface between the source region 13 and drain region 14 is a gate thermal oxide film (called "third gate thermal oxide film" after FIG. 2) 10a. Provided at the surface between the source region 15 and drain region 16 is a gate thermal oxide film (called "second gate thermal oxide film" after FIG. 2) 7e. Provided at the surface between the source region 17 and drain region 18 is a gate thermal oxide film (called "second gate thermal oxide film") 7f. Provided on the gate thermal oxide film 10a is a second conducting layer 11a. Provided on the gate thermal oxide film 7e is a first conducting layer 8e. Provided on the gate thermal oxide film 7f are a first conducting layer 8f, an insulating film 9f and a second conducting layer 11f in a multi-layered manner. There are provided side walls 12 at the side surfaces of the third gate thermal oxide film 10a, gate thermal oxide films 7e, 7f, first conducting layers 8e, 8f, insulating film 9f, and second conducting layers 11a, 11f, respectively.

The gate thermal oxide film 10a and second conducting layer 11a are the gate thermal oxide film having a thickness of Tl and the gate electrode of the first processing circuit portion Q1n, respectively. The gate thermal oxide film 7e and first conducting layer 8e are the gate thermal oxide film having a thickness of T2 and the gate electrode of the second processing circuit portion Q2n, respectively. The gate thermal oxide film 7f, first conducting layer 8f, insulating film 9f and second conducting layer 11f are: the gate thermal oxide film having a thickness of Tf; a lower gate electrode; a film for separating an upper gate electrode and the lower gate electrode; and the upper gate electrode; respectively.

In this embodiment, the gate electrode (second conducting layer 11a) of the first processing circuit portion Q1n is formed by the same process as the upper gate electrode (second conducting layer 11f) of a memory circuit portion Qm, while the gate electrode (first conducting layer 8e) of the second processing circuit portion Q2n is formed by the same process as the lower gate electrode (first conducting layer 8f) of the memory circuit portion Qm. Further, in the present invention, the manufacturing process is conducted by separating the forming process of the gate thermal oxide film 10a of the first processing circuit portion, from the forming process of the gate thermal oxide film 7e of the second processing circuit portion. This allows to differently form the film thicknesses T1, T2 of the gate thermal oxide films as required by the respective processing circuits, and enables production of gate thermal oxide films only with errors on the order of ±1 angstrom.

There will be now described the manufacturing method of the present invention corresponding to the constitution of FIG. 1, with reference to FIGS. 2 through 11 and FIG. 1.

Figure 2:
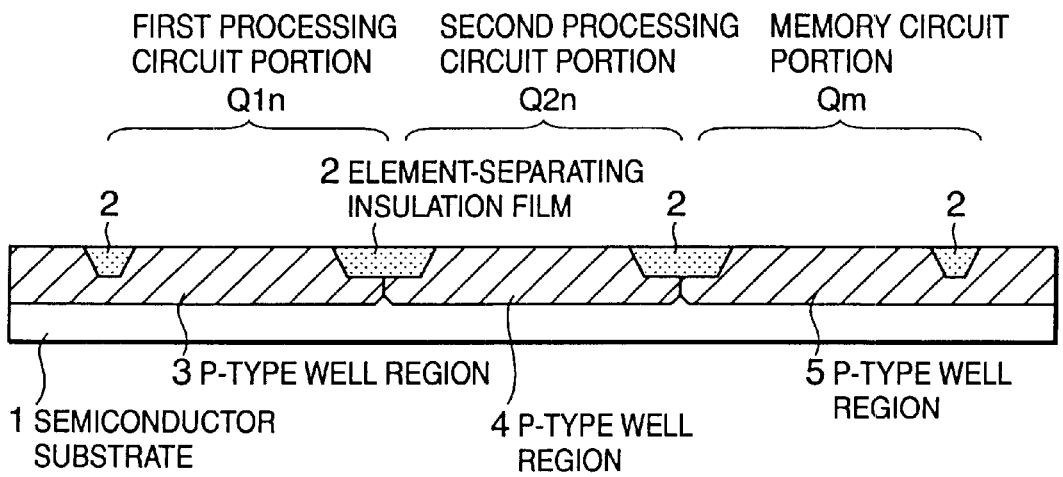
FIG. 2 is a cross-sectional view showing a first manufacturing step of the semiconductor device of FIG. 1.
Figure 3:
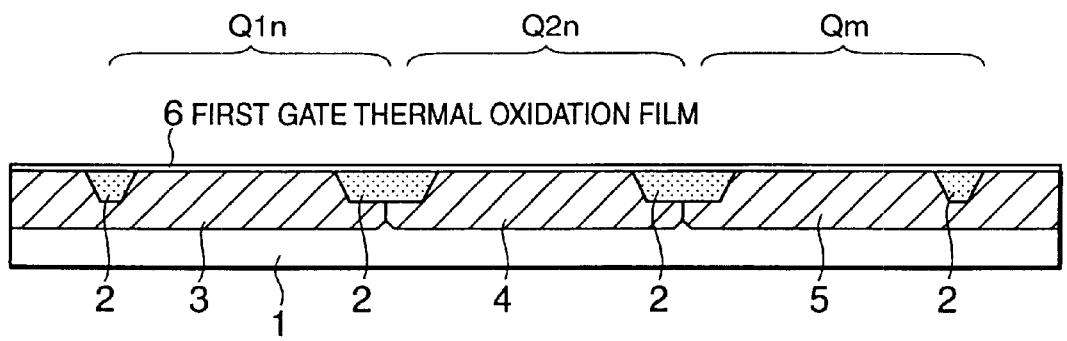
FIG. 3 is a cross-sectional view showing a manufacturing step following the manufacturing step of FIG. 2.

Firstly, as shown in FIG. 2, there is prepared such a situation that: the element-separating insulation film 2 is formed on the one-conductive type of semiconductor substrate 1; and the p-type well region 3, p-type well region 4 and p-type well region 5 are formed in the element forming regions of the first processing circuit portion Q1n, second processing circuit portion Q2n and memory circuit portion Qm, respectively. Next, as shown in FIG. 3, there is grown a first gate thermal oxide film 6 into a thickness of 40 angstroms to 90 angstroms, over the surfaces of the element-separating insulation film 2 and p-type well regions 3, 4, 5.

Figure 4:
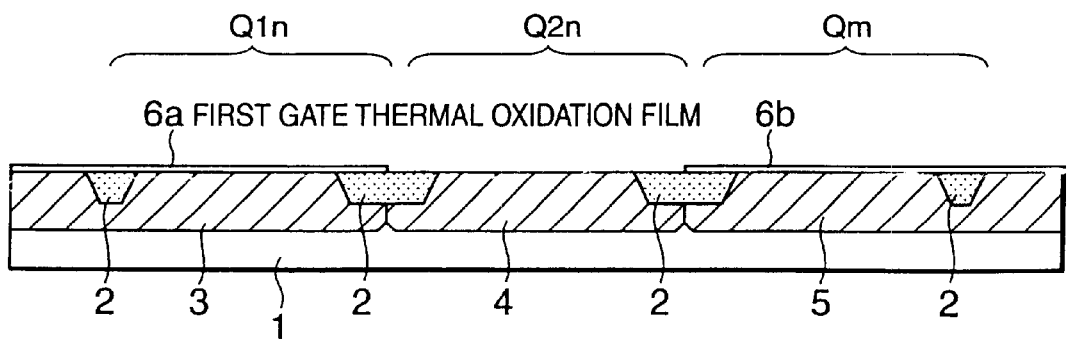
FIG. 4 is a cross-sectional view showing a manufacturing step following the manufacturing step of FIG. 3.

Further, as shown in FIG. 4, the first gate thermal oxide film 6 is patterned into first gate thermal oxide films 6a, 6b of predetermined shapes. The first gate thermal oxide film 6a is formed to be left in the element forming region of the first processing circuit portion Q1n, while the first gate thermal oxide film 6b is formed to be left in the element forming region of the memory circuit portion Qm.

Figure 5:
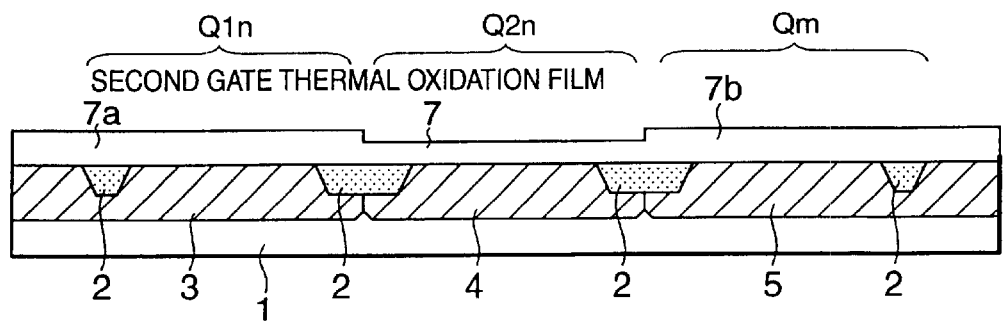
FIG. 5 is a cross-sectional view showing a manufacturing step following the manufacturing step of FIG. 4.

Next, as shown in FIG. 5, there is formed a gate thermal oxide film over the entire surface. In the element forming region of the second processing circuit portion Q2n, there is grown a second gate thermal oxide film 7 into a thickness of 18 angstroms to 32 angstroms. At this time, the first gate thermal oxide film 6a of the first processing circuit portion Q1n and the first gate thermal oxide film 6b of the memory circuit portion Qm are further deposited into a second gate thermal oxide film 7a and a second gate thermal oxide film 7b each having a thickness of 50 angstroms to 100 angstroms.

Figure 6:
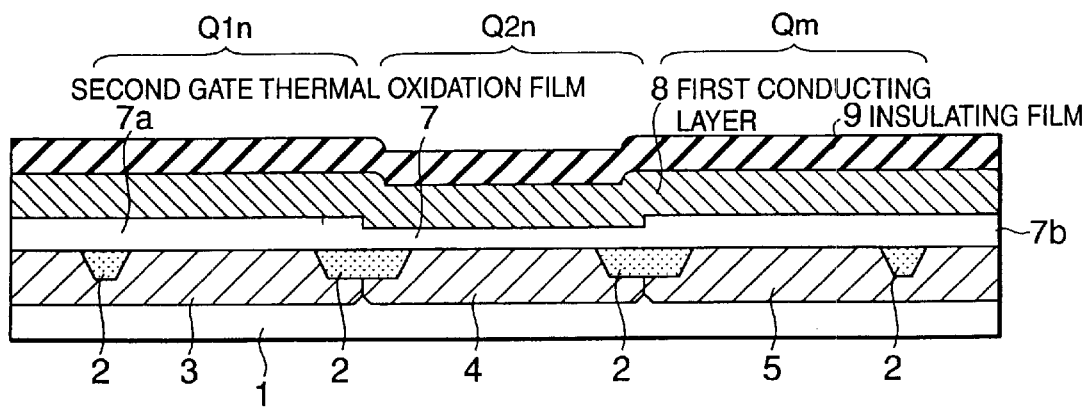
FIG. 6 is a cross-sectional view showing a manufacturing step following the manufacturing step of FIG. 5.

Next, as shown in FIG. 6, there are formed a first conducting layer 8 and an insulating film 9, over the surfaces of the second gate thermal oxide film 7a, second gate thermal oxide film 7b and second gate thermal oxide film 7. The first conducting layer 8 can be formed such as by growing a polycrystalline silicon film to be deposited by a CVD method. Further, for the insulating film 9, it is possible to adopt an ONO film having a three-layer structure comprising an oxide film, a nitride film and another oxide film such as deposited by a CVD method.

Figure 7:
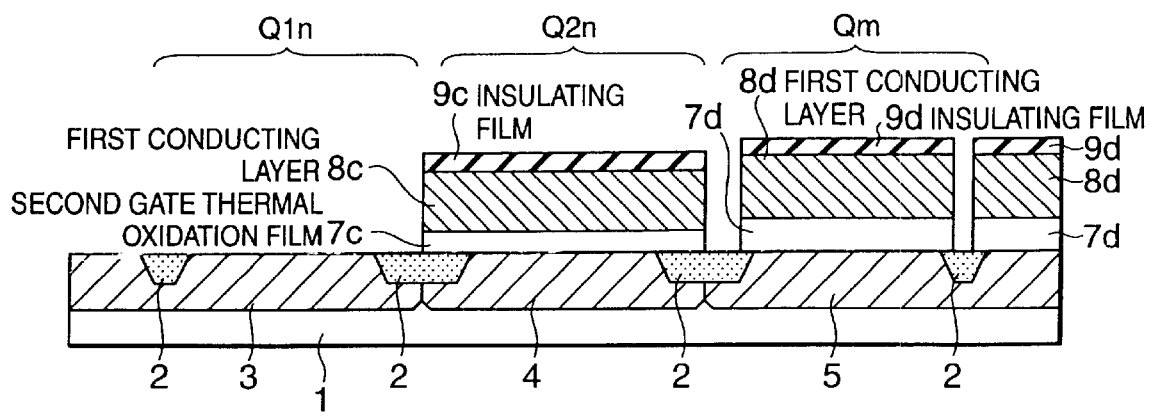
FIG. 7 is a cross-sectional view showing a manufacturing step following the manufacturing step of FIG. 6.

Next, as shown in FIG. 7, the second gate thermal oxide film 7 is patterned into a second gate thermal oxide film 7c of a predetermined shape, and the second gate thermal oxide film 7b is patterned into a second gate thermal oxide film 7d of a predetermined shape. Further, the first conducting layer 8 is patterned into first conducting layers 8c, 8d of predetermined shapes, and the insulating film 9 is patterned into insulating films 9c, 9d of predetermined shapes. The second gate thermal oxide film 7c, first conducting layer 8c and insulating film 9c are formed to be left in the element forming region of the second processing circuit portion Q2n, while the second gate thermal oxide film 7d, first conducting layer 8d and insulating film 9d are formed to be left in the element forming region of the memory circuit portion Qm.

Figure 8:
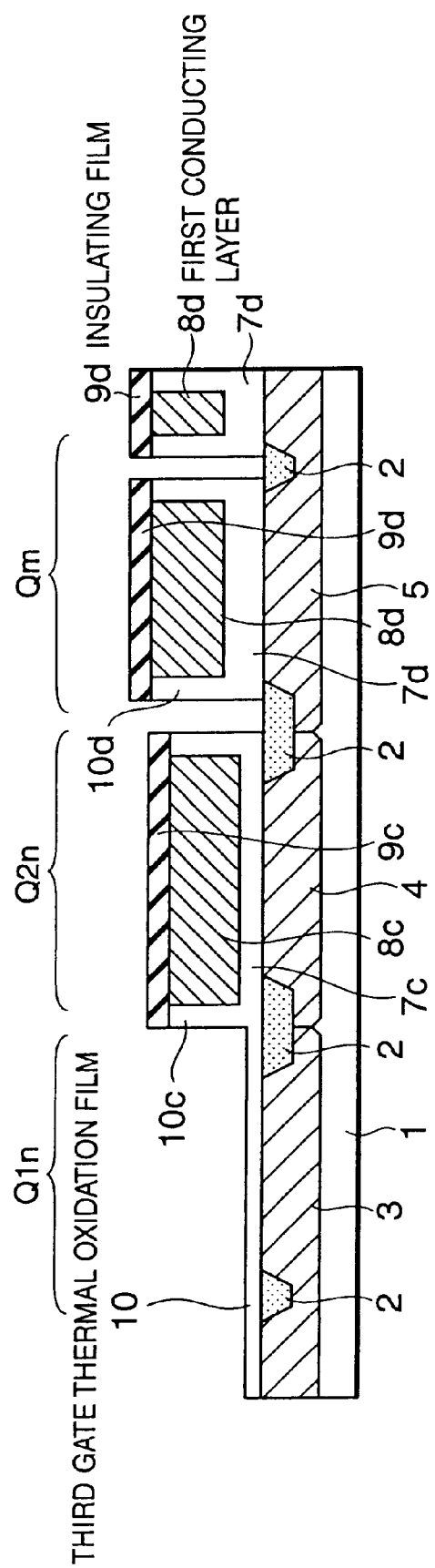
FIG. 8 is a cross-sectional view showing a manufacturing step following the manufacturing step of FIG. 7.

Next, as shown in FIG. 8, there is formed a thermal oxide film over the entire surface. In the element forming region of the first processing circuit portion Qln, there is formed a third gate thermal oxide film 10 having a thickness of 15 angstroms to 25 angstroms. At this time, there is formed an oxide film 10c along the side surface of the first conducting layer 8c of the second processing circuit portion Q2n, and there is formed an oxide film 10d along the side surface of the first conducting layer 8d of the memory circuit portion Qm. At this time, no third gate thermal oxide films are formed on the insulating film 9c of the second processing circuit portion Q2n and on the insulating film 9d of the memory circuit portion Qm, because of the nature of the ONO film.

Figure 9:
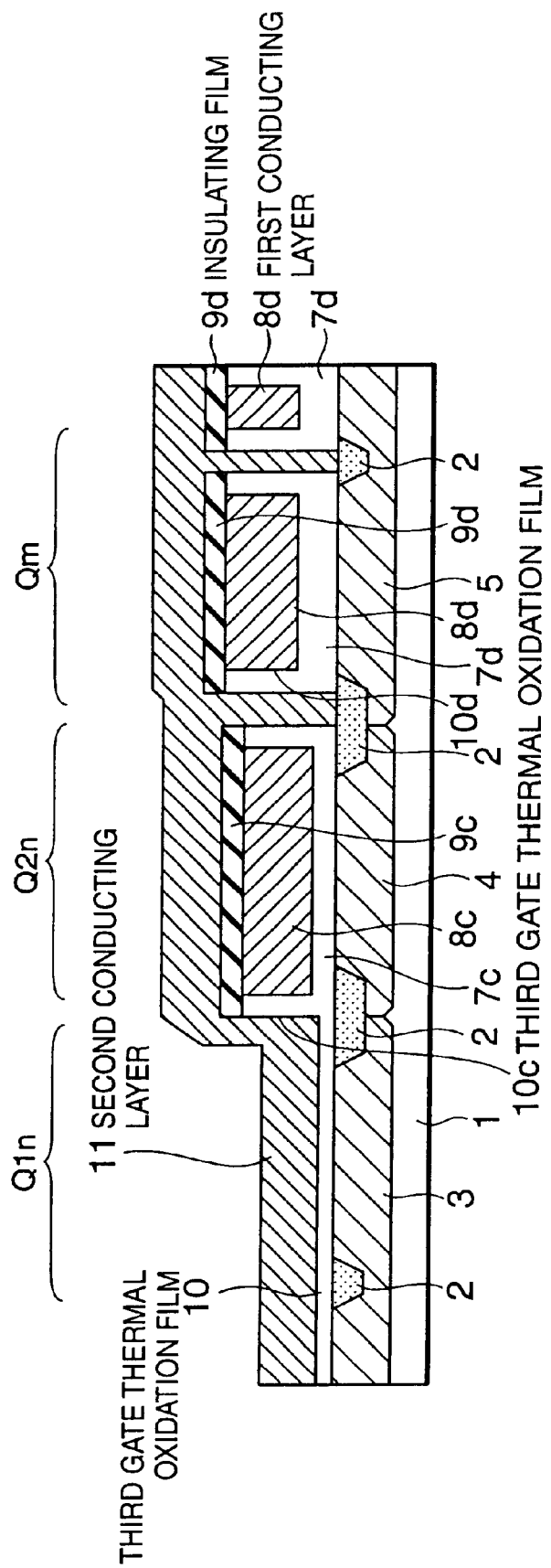
FIG. 9 is a cross-sectional view showing a manufacturing step following the manufacturing step of FIG. 8.

Next, as shown in FIG. 9, there is formed a second conducting layer 11 over the entire surface of the semiconductor substrate 1, including over the third gate thermal oxide film 10, insulating film 9c and insulating films 9d. The second conducting layer 11 can be formed in the same manner as the first conducting layer 8, such as by growing a polycrystalline silicon film deposited by a CVD method.

Figure 10:
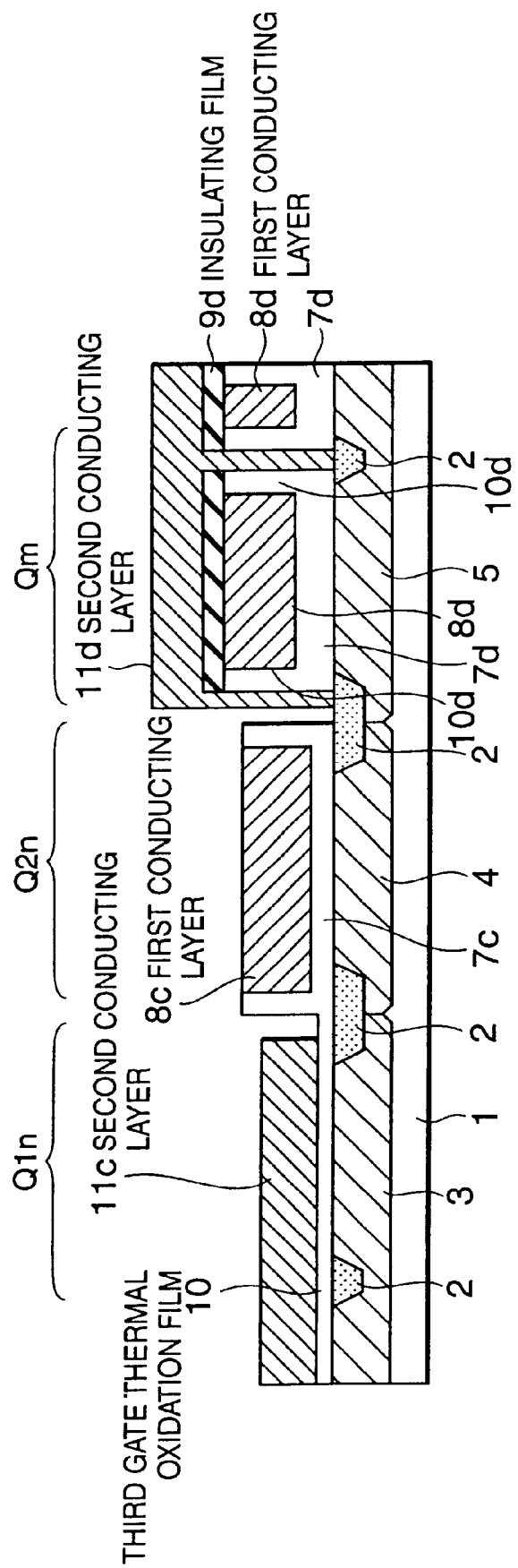
FIG. 10 is a cross-sectional view showing a manufacturing step following the manufacturing step of FIG. 9.

Next, as shown in FIG. 10, the second conducting layer 11 is patterned into second conducting layers 11c, 11d of predetermined shapes. Here, the second conducting layer 11c is formed to be left in the element forming region of the first processing circuit portion Q1n, and the second conducting layer 11d is formed to be left in the element forming region of the memory circuit portion Qm. The insulating film 9c of second processing circuit portion Q2n (FIG. 9) is eliminated by etching. Note, the insulating film 9d of the memory circuit portion is not etched, since the insulating film 9d is covered by the second conducting layer 11d of Qm.

Figure 11:
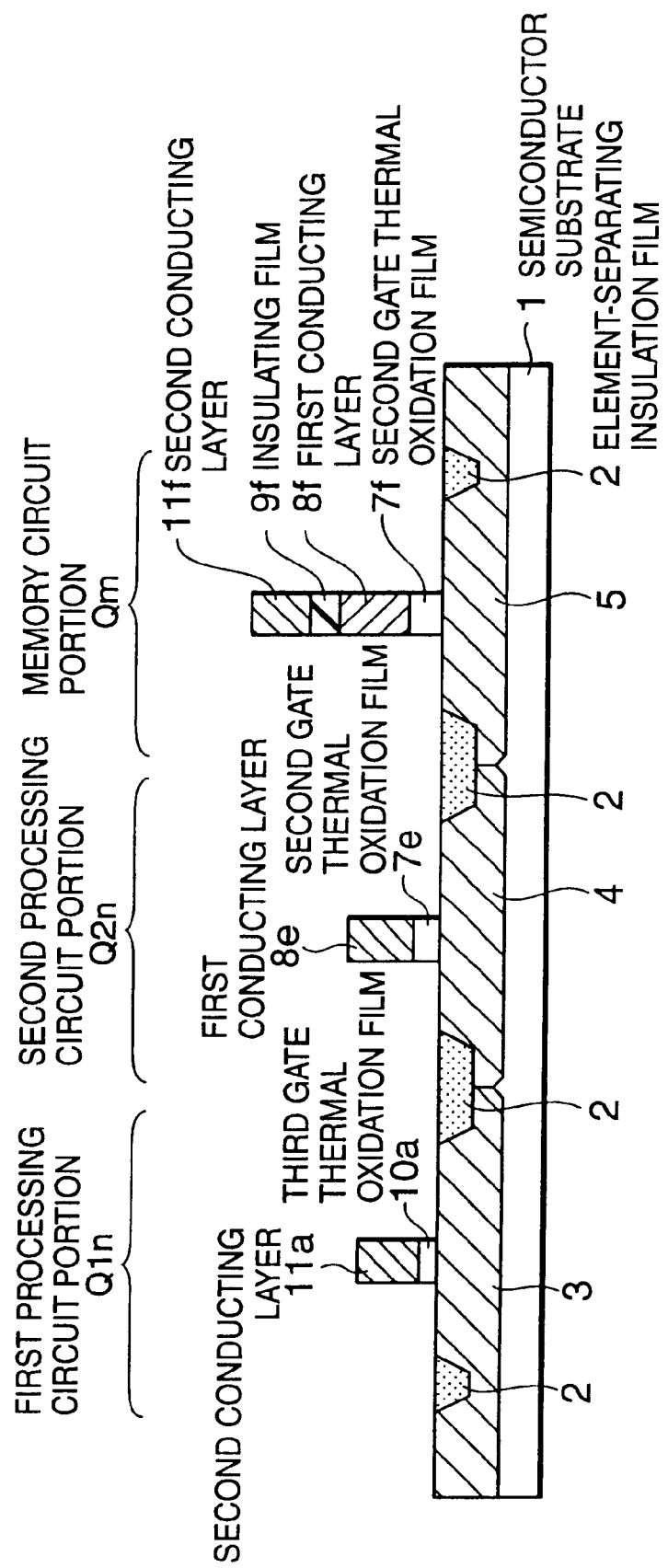
FIG. 11 is a cross-sectional view showing a manufacturing step following the manufacturing step of FIG. 10.

Next, as shown in FIG. 11, there is conducted patterning. Namely, the second gate thermal oxide film 7c is patterned into the second gate thermal oxide film 7e of a predetermined shape, and the second gate thermal oxide film 7d is patterned into the second gate thermal oxide film 7f of a predetermined shape. Further, the first conducting layer 8c is patterned into the first conducting layer 8e of a predetermined shape, the first conducting layer 8d is patterned into the first conducting layer 8f of a predetermined shape, and the insulating film 9d is patterned into the second gate thermal oxide film 9f of a predetermined shape. Moreover, the third gate thermal oxide film 10 is patterned into the third gate thermal oxide film 10a of a predetermined shape, the second conducting layer 11c is patterned into the second conducting layer 11a of a predetermined shape, and the second conducting layer 11d is patterned into the second conducting layer 11f of a predetermined shape.

Upon patterning, there are eliminated: the oxide film 10c along the side surface of the first conducting layer 8c and the oxide film 10d along the side surface of the first conducting layer 8d. The third gate thermal oxide film 10a and second conducting layer half constitute the gate thermal oxide film and gate electrode of the first processing circuit portion Q1n, respectively. Further, the second gate thermal oxide film 7e and first conducting layer 8e constitute the gate thermal oxide film and gate electrode of the second processing circuit portion Q2n. Concerning the memory circuit portion Qm, the second gate thermal oxide film 7f, first conducting layer 8f, insulating film 9f and second conducting layer 11f form: the gate thermal oxide film; a lower gate electrode; an insulating film for separating an upper gate electrode and the lower gate electrode; and the upper gate electrode; respectively.

Next, as shown in FIG. 1, there are formed side walls 12 along the side surfaces of the second gate thermal oxide film 7e, second gate thermal oxide film 7f, first conducting layer 8e, first conducting layer 8f, insulating film 9f, third gate thermal oxide film 10a, second conducting layer 11a and second conducting layer 11f, respectively. The side walls 12 are formed such as by growing an insulating film comprising a silicon oxide film or silicon nitride film by a CVD method, and by conducting anisotropic etching by a RIE method. Further, there are formed the source region 13 and drain region 14 by introducing n-type impurities into the first processing circuit portion Q1n. It is possible to adopt arsenic as the n-type impurities, for example. Further, there are formed the source region 15 and drain region 16, by introducing n-type impurities into the second processing circuit portion Q2n. Similarly, there are formed the source region 17 and drain region 18, by introducing n-type impurities into the memory circuit portion Qm.

According to the above described manufacturing method as depicted in FIGS. 1 through 11, the gate thermal oxide film of the first processing circuit portion is brought into a thickness exceeding 10 angstroms and the gate thermal oxide film of the second processing circuit portion is brought into a thickness exceeding 10 angstroms, while allowing to limit the thickness difference therebetween to 10 angstroms or less. As a result, it becomes possible to form the gate thermal oxide films of the required thicknesses at the processing circuit portions, respectively. This is because the gate thermal oxide film 10a of the first processing circuit portion and the gate thermal oxide film 7e of the second processing circuit portion are formed by those processes fully different from each other.

In the aforementioned embodiment, the first gate thermal oxide film 6a shown in FIG. 4 can be eliminated upon patterning. Further, it is possible to change the forming order or sequence of the source region 13 and drain region 14, the source region 15 and drain region 16, and the source region 17 and drain region 18 shown in FIG. 1.

In the above embodiment, the first processing circuit portion Q1n and second processing circuit portion Q2n have been constituted of n-channel type MOS-transistors. However, they may be p-channel type MOS-transistors. In such a situation, the p-type well region 3 and p-type well region 4 shall be replaced by n-type well regions, while introducing p-type impurities into the source region 13 and drain region 14 as well as into the source region 15 and drain region 16. Such p-type impurities may include boron. It is also possible to simultaneously incorporate the first processing circuit portion Q1n based on an n-channel type MOS-transistor and a first processing circuit portion (Q1p) based on a p-channel type MOS-transistor. In this case, it is possible to form a source region and a drain region of the first processing circuit portion (Q1p) of the p-channel type MOS-transistor, by forming an n-type well region in the element forming region for the first processing circuit portion (Q1p) of the p-channel type MOS-transistor separately from the p-type well region 3 shown in FIG. 1, and by introducing p-type impurities into the first processing circuit portion (Q1p) of the p-channel type MOS-transistor by a process different from that for the source region 13 and drain region 14.

It is further possible to simultaneously incorporate the second processing circuit portion Q2n based on an n-channel type MOS-transistor and a second processing circuit portion (Q2p) based on a p-channel type MOS-transistor. In this case, it is possible to form a source region and a drain region of the second processing circuit portion (Q2p) of the p-channel type MOS-transistor, by forming an n-type well region in the element forming region for the second processing circuit portion (Q2p) of the p-channel type MOS-transistor separately from the p-type well region 4 shown in FIG. 1, and by introducing p-type impurities into second processing circuit portion (Q2p) of the p-channel type MOS-transistor by a process different from that for the source region 15 and drain region 16.

There will be described hereinafter a second embodiment of the present invention.

Figure 12:
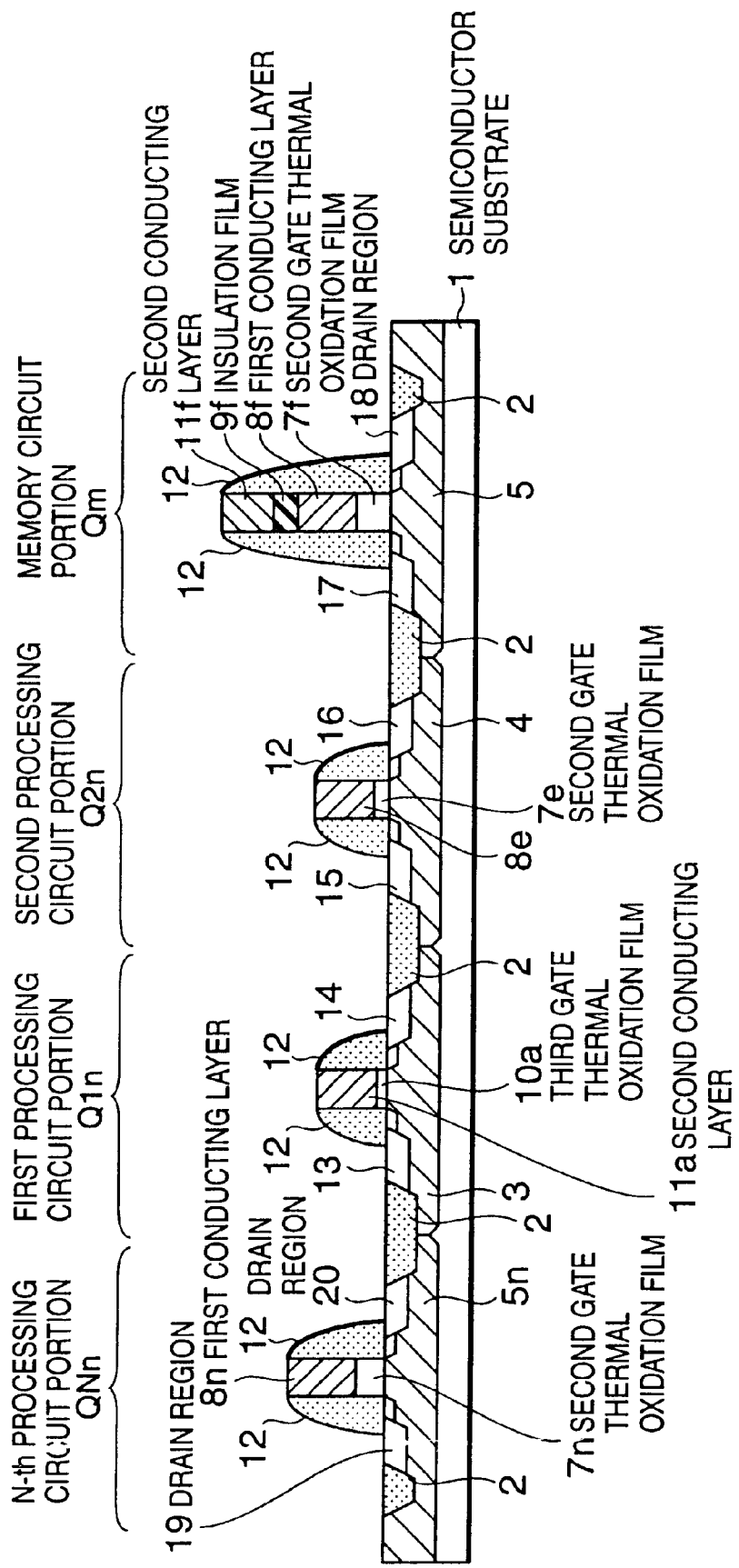
FIG. 12 is a cross-sectional view showing another embodiment of a semiconductor device according to the present invention.

FIG. 12 shows another embodiment of semiconductor device according to the present invention.

This embodiment relates to a situation where three or more types of processing circuit portions (hereinafter called "N-th processing circuit") are incorporated, whereas the above embodiment has been related to an example of the semiconductor device incorporating two kinds of semiconductor processing circuit portions and one kind of memory circuit portion.

As shown in FIG. 12, formed on the semiconductor substrate 1 are p-type well regions 3, 4, 5, 5n, and element-separating insulation films 2 are provided at predetermined positions of these regions, respectively. Formed around the element-separating insulation films 2 are source regions 13, 15, 17, 19 and drain regions 14, 16, 18, 20. Provided on the surface between the source region 13 and drain region 14 is a third gate thermal oxide film 10a. Provided on the surface between the source region 15 and drain region 16 is a gate thermal oxide film 7e. Provided on the surface between the source region 17 and drain region 18 is a gate thermal oxide film 7f. Provided on the surface between the source region 19 and drain region 20 is a gate thermal oxide film 7n. Provided on the third gate thermal oxide film 10a and gate thermal oxide film 7e are a second conducting layer 11a and a first conducting layer 8e, respectively. Provided on the gate thermal oxide film 7f are a first conducting layer 8f, and insulating film 9f and a second conducting layer 11f in a multi-layered manner. Provided on the gate thermal oxide film 7n is a first conducting layer 8n. There are provided side walls 12 at the side surfaces of the third gate thermal oxide film 10a, gate thermal oxide films 7e, 7f, 7n, first conducting layers 8e, 8f, 8n, insulating film 9f and second conducting layers 11a, 11f, respectively.

Here, the gate thermal oxide film 7n is a gate insulating film having a thickness of 70 angstroms to 110 angstroms of an N-th processing circuit portion QNn, and the first conducting layer 8n is a gate electrode of the N-th processing circuit portion QNn.

There will be now described the manufacturing method of the present invention corresponding to the constitution of FIG. 12, with reference to FIGS. 12 through 24.

Figure 13:
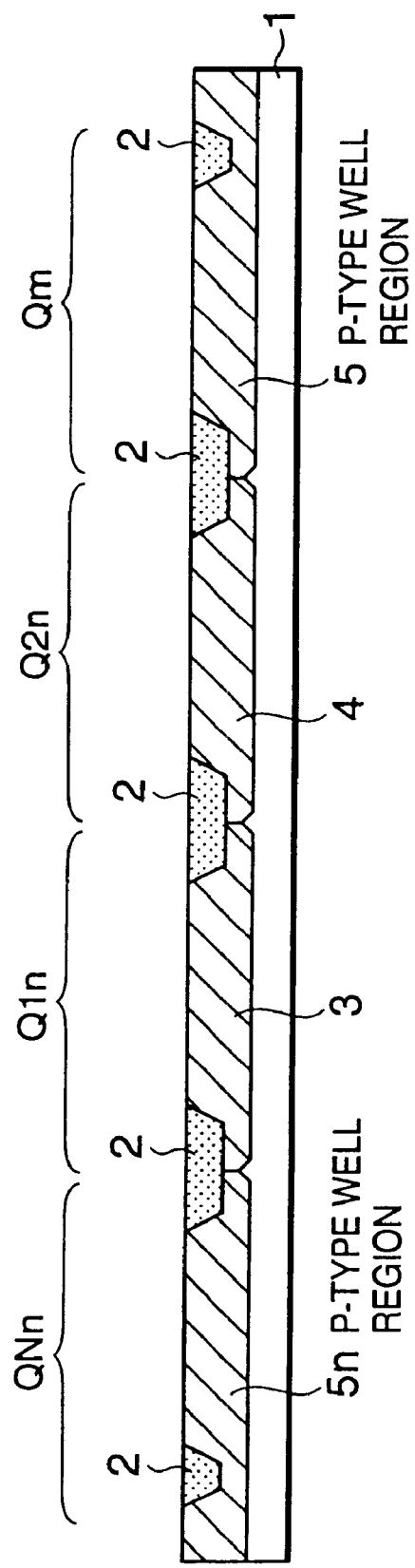
FIG. 13 is a cross-sectional view showing a manufacturing step following the manufacturing step of FIG. 12.

Firstly, as shown in FIG. 13, there are formed element-separating insulation films 2 on the one-conductive type of semiconductor substrate 1, so as to form a device formed with an element region for the N-th processing circuit portion QNn separately from the element regions Q1n, Q2n, Qm.

Figure 14:
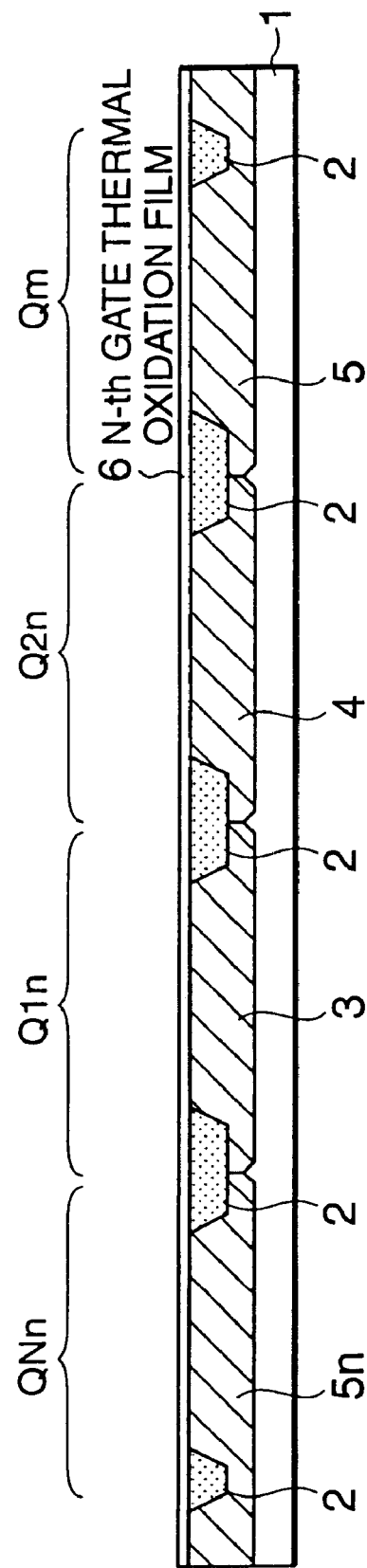
FIG. 14 is a cross-sectional view showing a manufacturing step following the manufacturing step of FIG. 13.

Next, as shown in FIG. 14, grown over the entire surface of the semiconductor substrate 1 is an N-th gate thermal oxide film 6' having a thickness of 30 angstroms exclusive to 80 angstroms inclusive.

Figure 15:
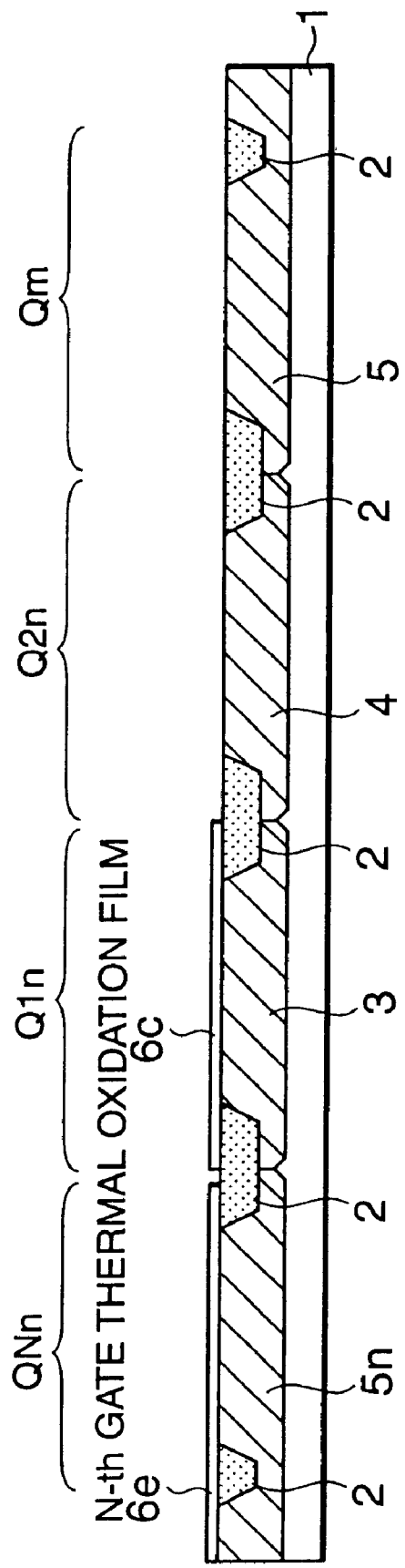
FIG. 15 is a cross-sectional view showing a manufacturing step following the manufacturing step of FIG. 14.

Next, as shown in FIG. 15, the N-th gate thermal oxide film 6' is patterned into N-th gate thermal oxide films 6'c, 6'e of predetermined shapes. The N-th gate thermal oxide film 6'c is formed to be left in the element forming region of the first processing circuit portion Q1n. Further, the N-th gate thermal oxide film 6'e is formed to be left in the element forming region of the N-th processing circuit portion QNn, while eliminating the N-th gate thermal oxide films in the second processing circuit portion Q2n and memory circuit portion Qm.

Figure 16:
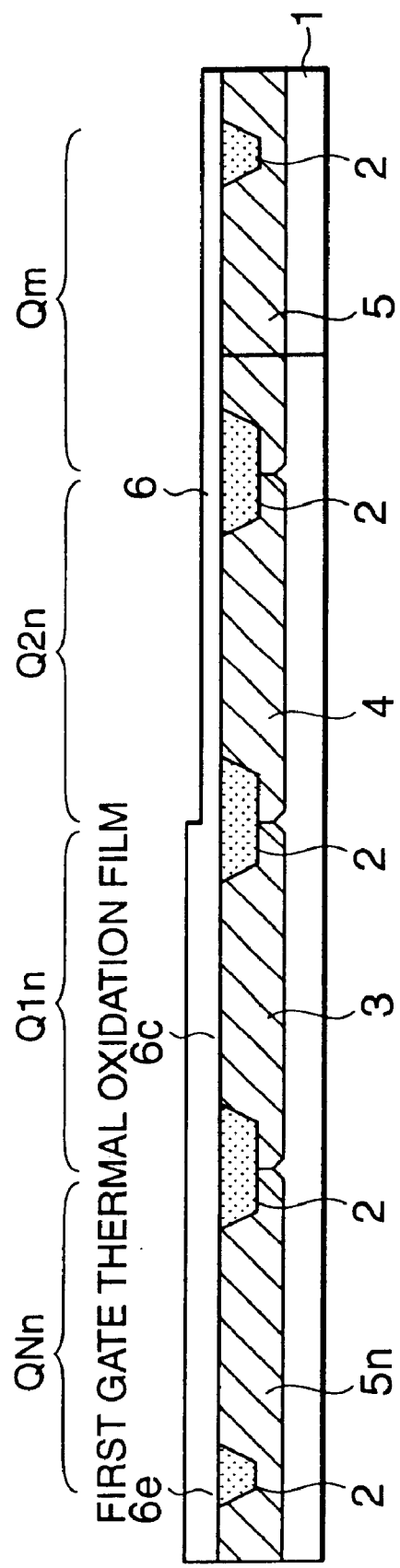
FIG. 16 is a cross-sectional view showing a manufacturing step following the manufacturing step of FIG. 15.

Next, as shown in FIG. 16, there is formed a first gate thermal oxide film over the entire surface of the semiconductor substrate 1. Namely, the first gate thermal oxide film 6 is grown to have a thickness of 40 angstroms to 90 angstroms over the entire surfaces of the second processing circuit portion Q2n and memory circuit portion Qm. The N-th gate thermal oxide film 6'c of the first processing circuit portion Q1n and the N-th gate thermal oxide film 6'e of the N-th processing circuit portion QNn are further deposited from the condition of FIG. 15, into a thickness of 60 angstroms exclusive to 100 angstroms inclusive. Hereinafter, the thermal oxide film of the first processing circuit portion Q1n and the thermal oxide film of the N-th processing circuit portion QNn are called a first gate thermal oxide film 6c and a first gate thermal oxide film 6e, respectively, since the shapes of these thermal oxide films are integrated into the formed first gate thermal oxide film.

Figure 17:
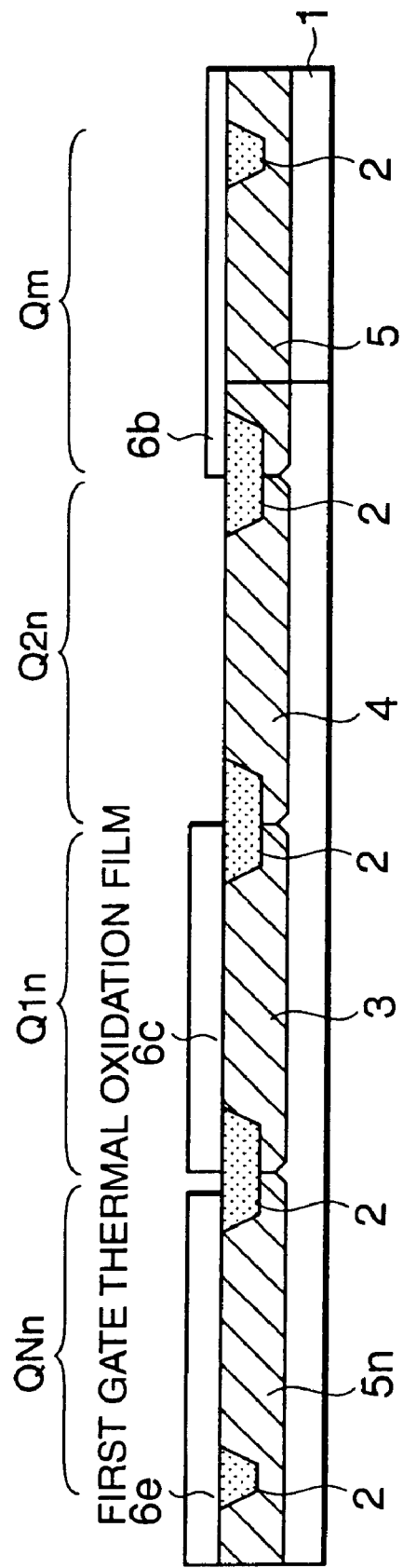
FIG. 17 is a cross-sectional view showing a manufacturing step following the manufacturing step of FIG. 16.

Next, as shown in FIG. 17, the first gate thermal oxide film 6, first gate thermal oxide film 6c and first gate thermal oxide film 6e are patterned into a first gate thermal oxide film 6b, a first gate thermal oxide film 6a and a first gate thermal oxide film 6g of predetermined shapes, respectively. The first gate thermal oxide film 6a is formed to be left in the element forming region of the first processing circuit portion Q1n. The first gate thermal oxide film 6g is formed to be left in the element forming region of the N-th processing circuit portion QNn, and the first gate thermal oxide film 6b is formed to be left in the element forming region of the memory circuit portion Qm. Further, there is eliminated the first gate thermal oxide film 6 provided in the region of the second processing circuit portion Q2n.

Figure 18:
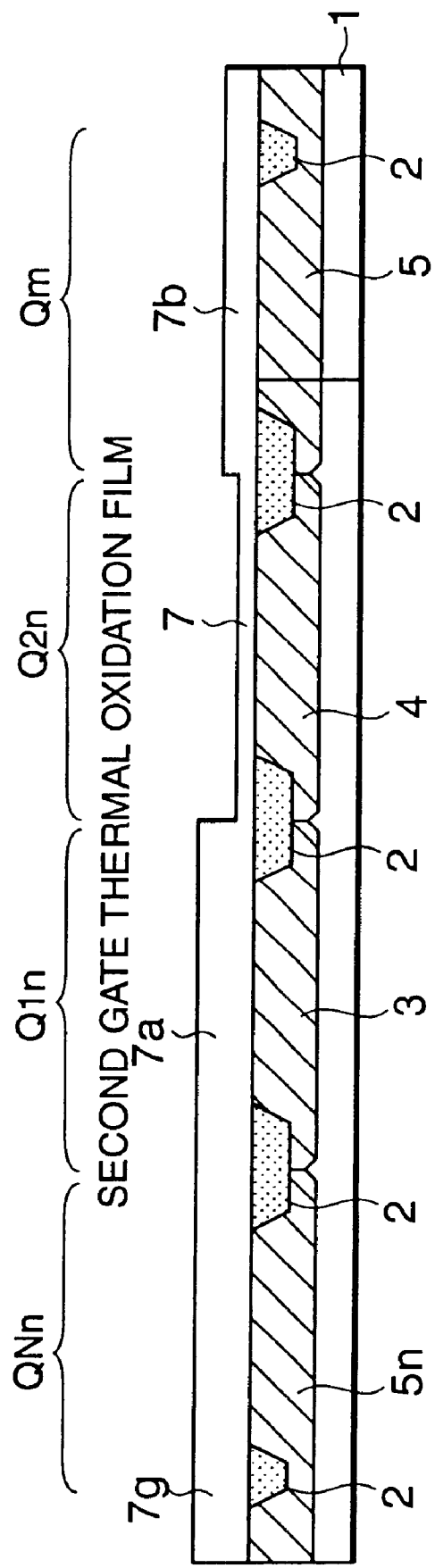
FIG. 18 is a cross-sectional view showing a manufacturing step following the manufacturing step of FIG. 17.

Next, as shown in FIG. 18, there is formed a second gate thermal oxide film over the entire surface of the semiconductor substrate 1. Namely, there is formed a second gate thermal oxide film 7 in the element forming region of the second processing circuit portion Q2n, so as to have a thickness of 18 angstroms to 32 angstroms. At this time, the first gate thermal oxide film 6a of the first processing circuit portion Q1n and the first gate thermal oxide film 6g of the N-th processing circuit portion QNn are further deposited into thicknesses of 70 angstroms to 110 angstroms. Similarly, the first gate thermal oxide film 6b of the memory circuit portion Qm is further deposited into a thickness of 50 angstroms to 100 angstroms. Hereinafter, the thermal oxide films of the first processing circuit portion Q1n, N-th processing circuit portion QNn and memory circuit portion Qm are called a second gate thermal oxide film 7a, a second gate thermal oxide film 7g and a second gate thermal oxide film 7b, respectively, since the shapes of these thermal oxide films are integrated into the formed second gate thermal oxide film.

Figure 19:
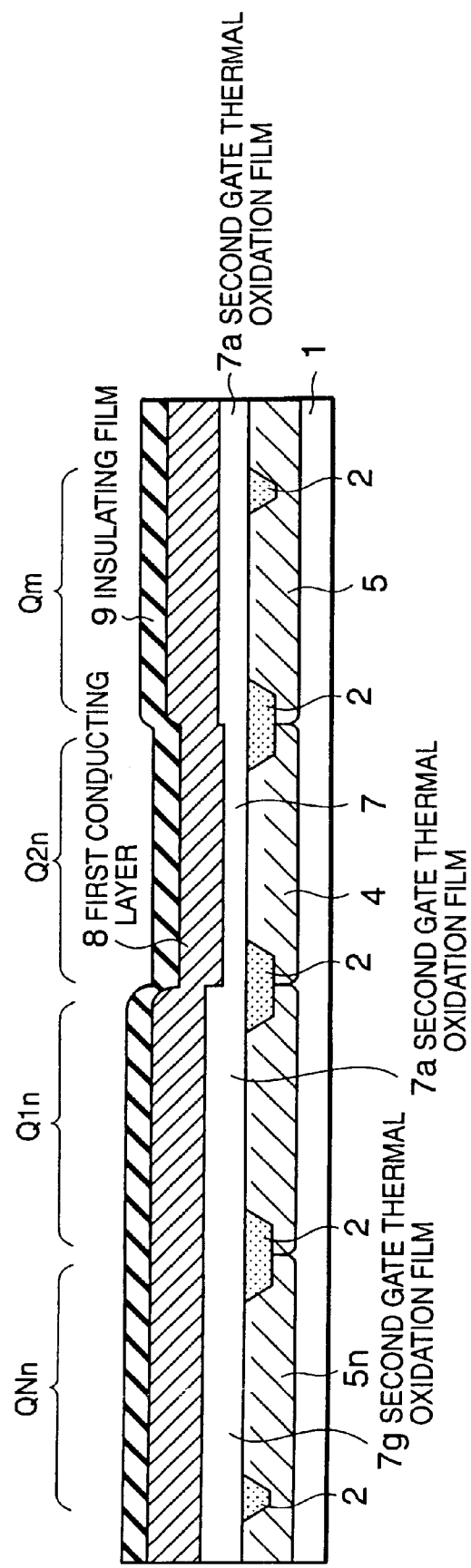
FIG. 19 is a cross-sectional view showing a manufacturing step following the manufacturing step of FIG. 18.

Next, as shown in FIG. 19, there are formed a first conducting layer 8 and an insulating film 9 over the entire surfaces of the second gate thermal oxide film 7, second gate thermal oxide film 7a, second gate thermal oxide film 7b and second gate thermal oxide film 7g. The first conducting layer 8 can be formed such as by growing a polycrystalline silicon film to be deposited by a CVD method. Further, for the insulating film 9, it is possible to adopt an ONO film having a three-layer structure comprising an oxide film, a nitride film and another oxide film such as deposited by a CVD method.

Figure 20:
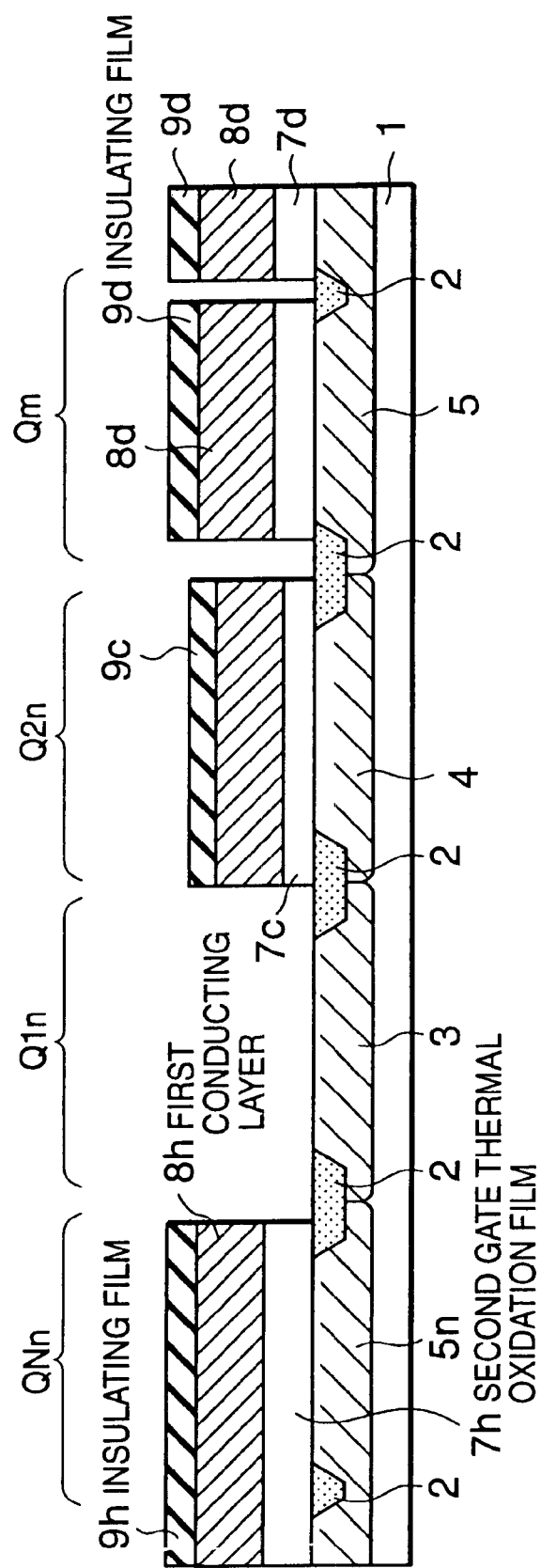
FIG. 20 is a cross-sectional view showing a manufacturing step following the manufacturing step of FIG. 19.

Next, as shown in FIG. 20, the second gate thermal oxide film 7, second gate thermal oxide film 7b, second gate thermal oxide film 7g, first conducting layer 8 and insulating film 9 are patterned into a second gate thermal oxide film 7c, a second gate thermal oxide film 7d, a second gate thermal oxide film 7h, first conducting layers 8c, 8d, 8h and insulating films 9c, 9d, 9h of predetermined shapes, respectively. The second gate thermal oxide film 7c, first conducting layer 8c and insulating film 9c are formed to be left in the element forming region of the second processing circuit portion Q2n. The second gate thermal oxide film 7h, first conducting layer 8h and insulating film 9h are formed to be left in the element forming region of the N-th processing circuit portion QNn. The second gate thermal oxide film 7d, first conducting layer 8d and insulating film 9d are formed to be left in the element forming region of the memory circuit portion Qm. The second gate thermal oxide film 7a has been eliminated.

Figure 21:
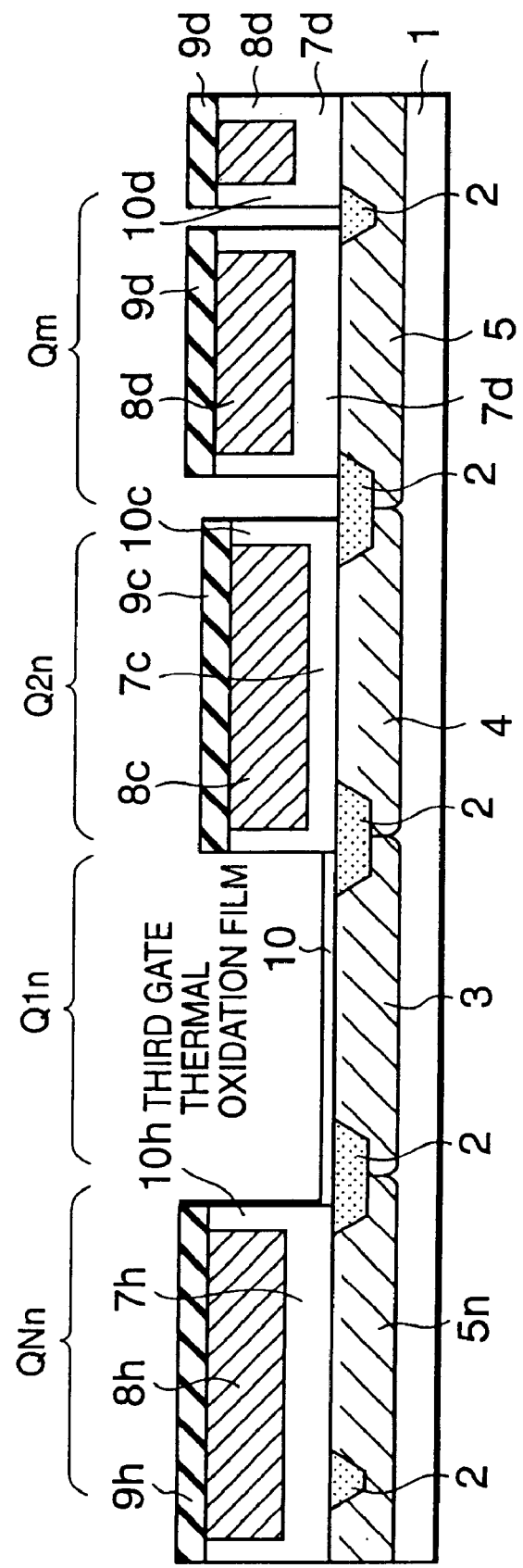
FIG. 21 is a cross-sectional view showing a manufacturing step following the manufacturing step of FIG. 20.

Next, as shown in FIG. 21, there is formed a third gate thermal oxide film 10 so as to have a thickness of 15 angstroms to 25 angstroms, in the element forming region of the first processing circuit portion Q1n. At this time, there are formed an oxide film 10c, an oxide film 10h and an oxide film 10d, along the side surface of the first conducting layer 8c of the second processing circuit portion Q2n, along the side surface of the first conducting layer 8h of the N-th processing circuit portion QNn, and along the side surface of the first conducting layer 8d of the memory circuit portion Qm, respectively. At this time, no third gate thermal oxide films are formed on the insulating film 9h of the N-th processing circuit portion QNn, on the insulating film 9c of the second processing circuit portion Q2n, and on the insulating film 9d of the memory circuit portion Qm, because of the nature of the ONO films.

Figure 22:
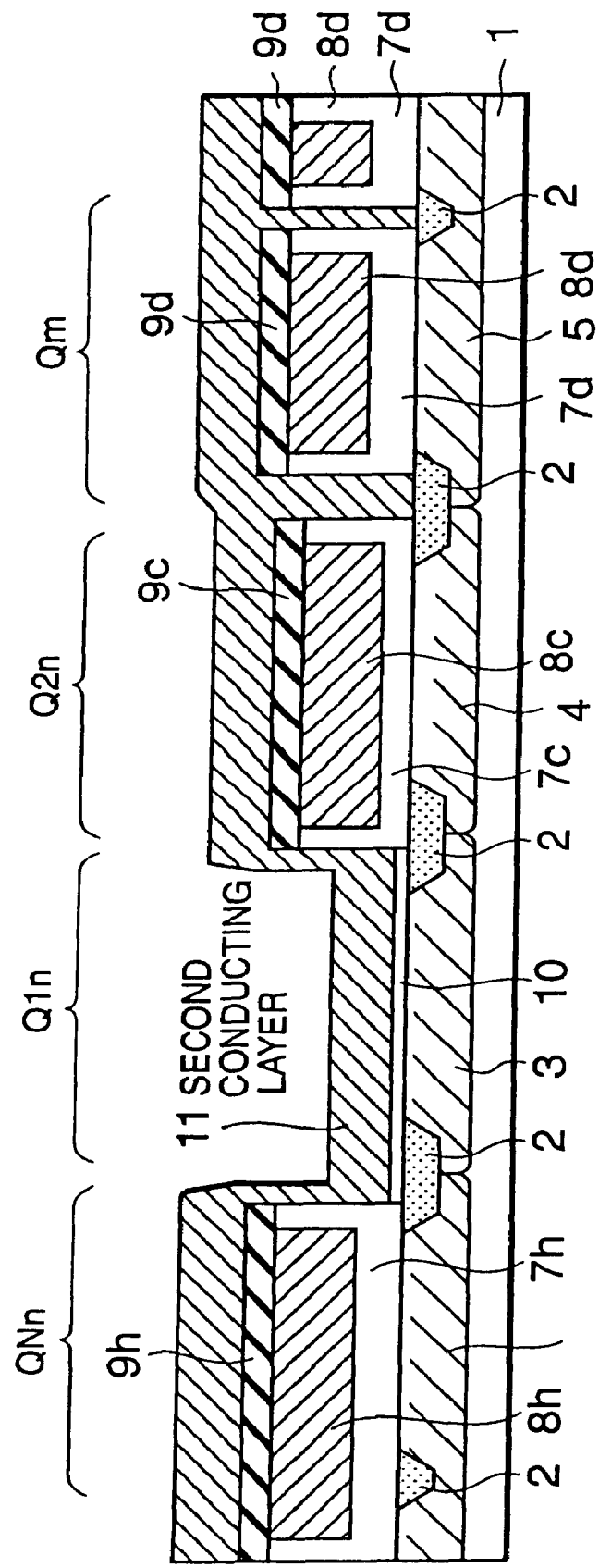
FIG. 22 is a cross-sectional view showing a manufacturing step following the manufacturing step of FIG. 21.

Next, as shown in FIG. 22, there is formed a second conducting layer 11 over the third gate thermal oxide film 10, insulating film 9c, insulating film 9d and insulating film 9h. The second conducting layer 11 can be formed such as by growing a polycrystalline silicon film deposited by a CVD method, similarly to the first conducting layer 8.

Figure 23:
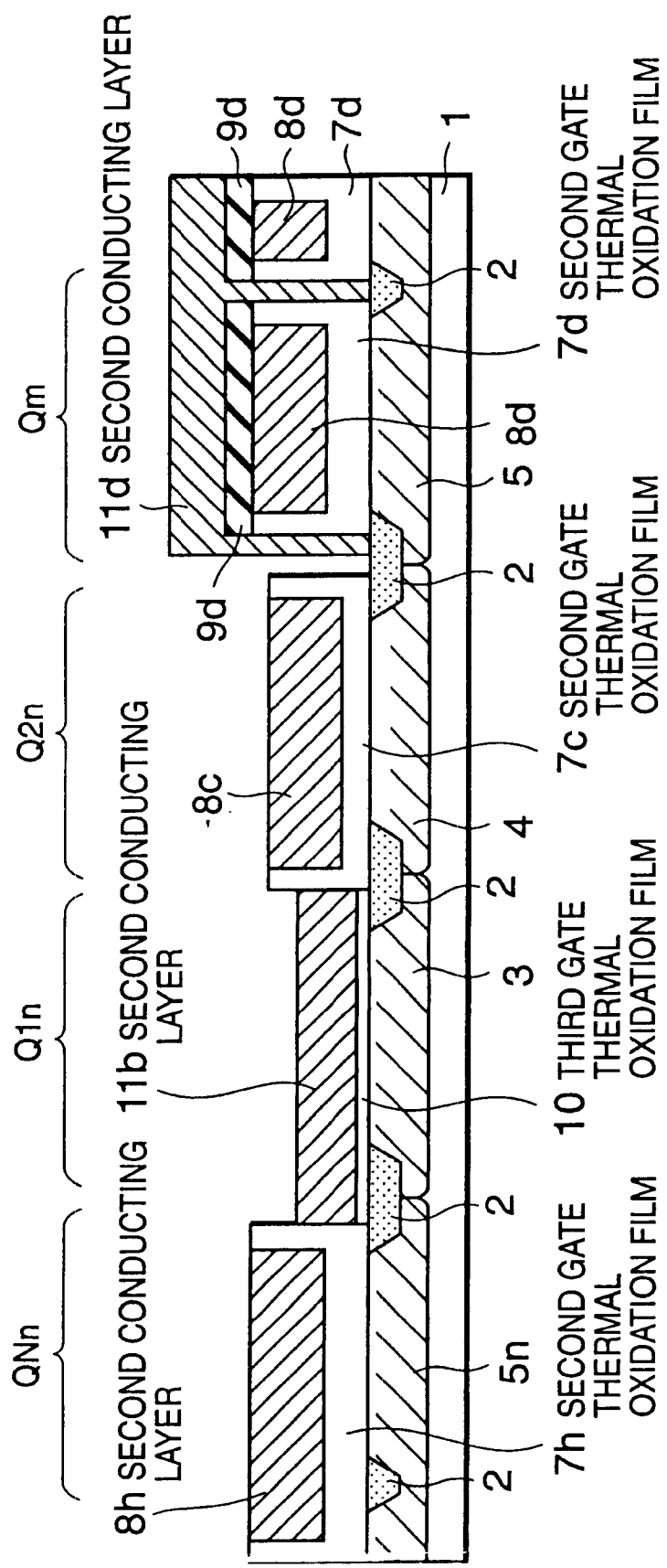
FIG. 23 is a cross-sectional view showing a manufacturing step following the manufacturing step of FIG. 22.

Next, as shown in FIG. 23, the second conducting layer 11 is patterned into predetermined shape 11b and 11d. The second conducting layer 11d is formed to be left in the element forming region of the first processing circuit portion Q1n. The second conducting layer 11d is formed to be left in th element forming region of the memory circuit portion Qm. The second conducting layer is formed in such a manner to be eliminated in the element forming region of the N-th processing circuit portion QNn and in the element forming region of the second processing circuit portion Q2n. Further, there have been etched the insulating film 9c of the second processing circuit portion and the insulating film 9h of the N-th processing circuit portion. At this time, the insulating film 9d of the memory circuit portion is not etched, since it is covered by the second conducting layer 11d of the memory circuit portion.

Figure 24:
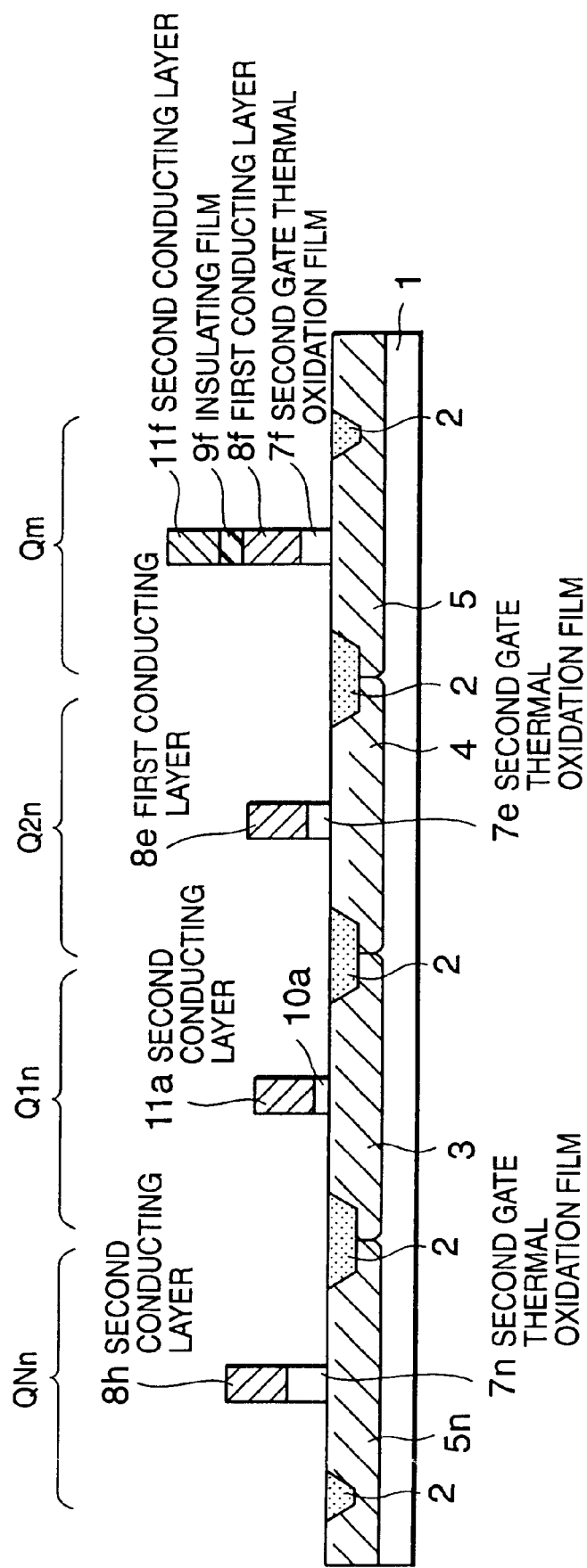
FIG. 24 is a cross-sectional view showing a manufacturing step following the manufacturing step of FIG. 23.
Figure 25:
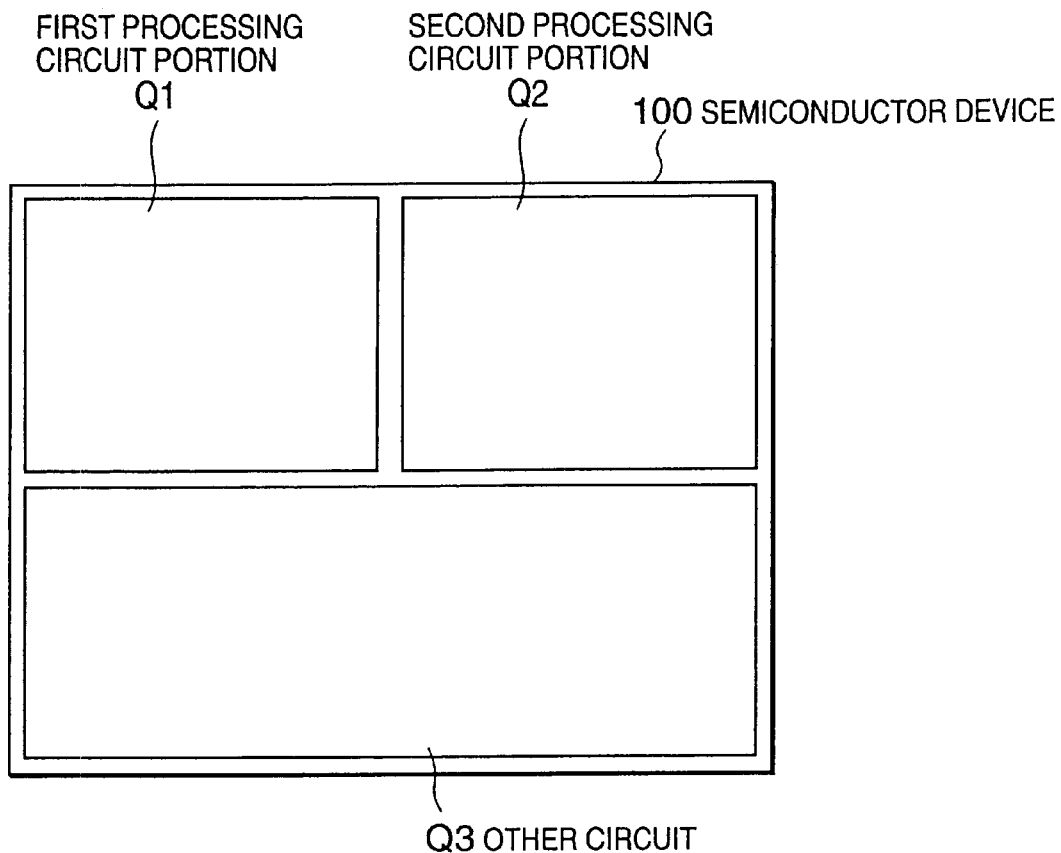
Figure 26:
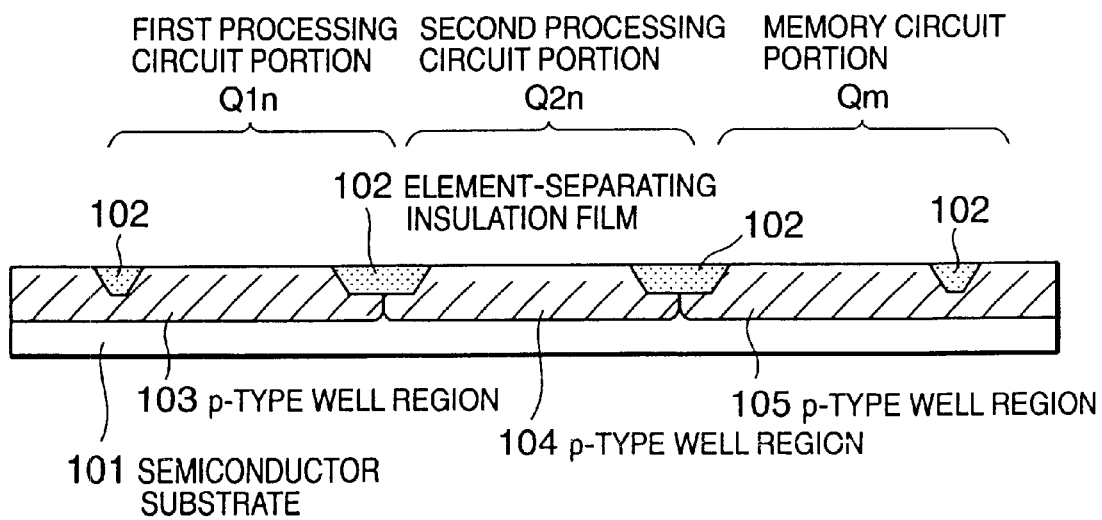
FIG. 26 is a cross-sectional view showing a first manufacturing step in a conventional manufacturing method of a semiconductor device.
Figure 27:
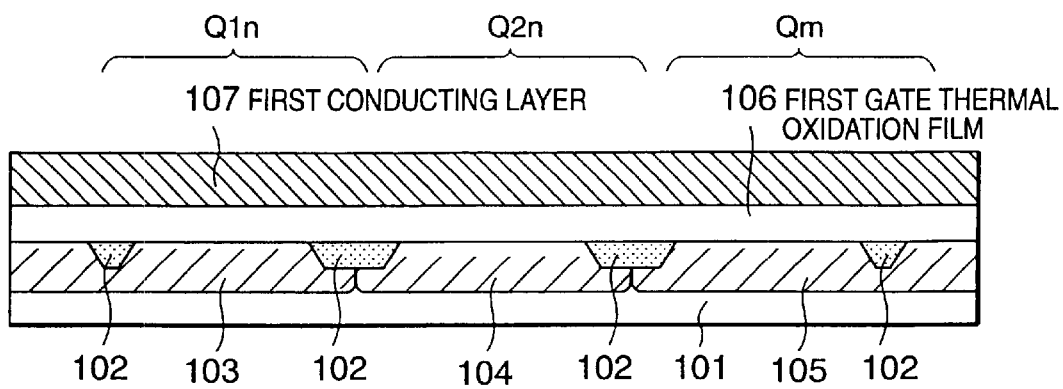
FIG. 27 is a cross-sectional view showing a manufacturing step following the manufacturing step of FIG. 26.
Figure 28:
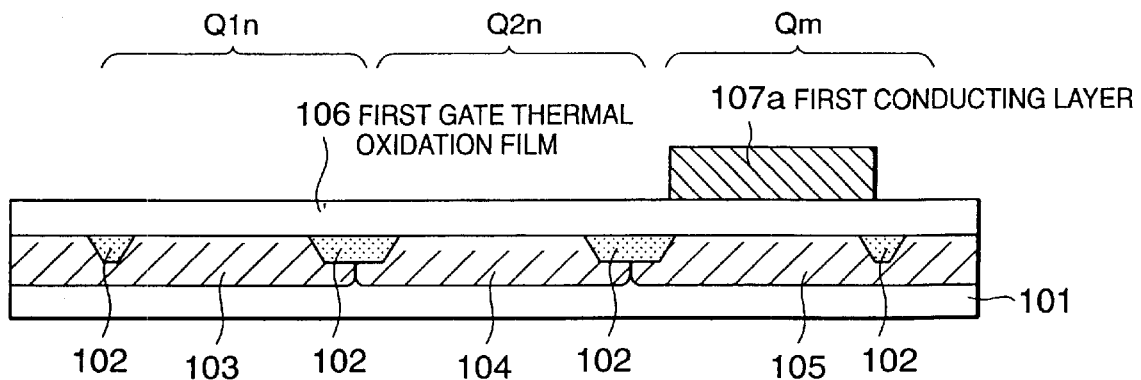
FIG. 28 is a cross-sectional view showing a manufacturing step following the manufacturing step of FIG. 27.
Figure 29:
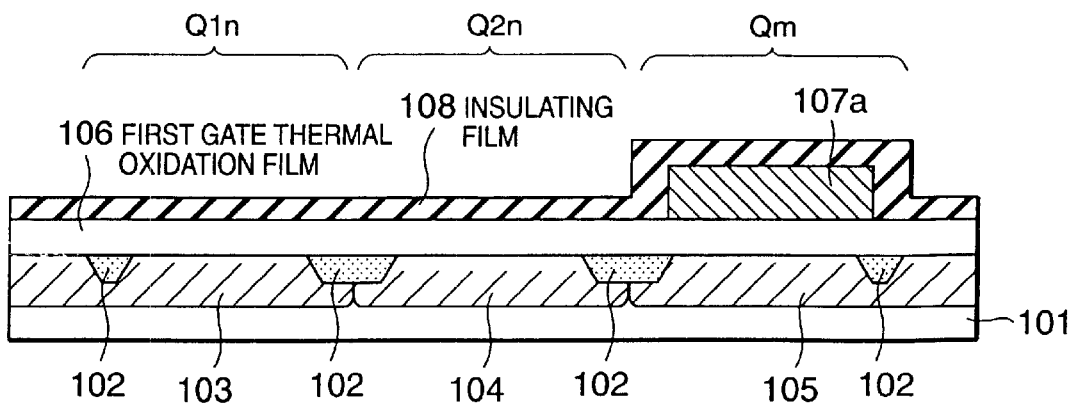
FIG. 29 is a cross-sectional view showing a manufacturing step following the manufacturing step of FIG. 28.
Figure 30:
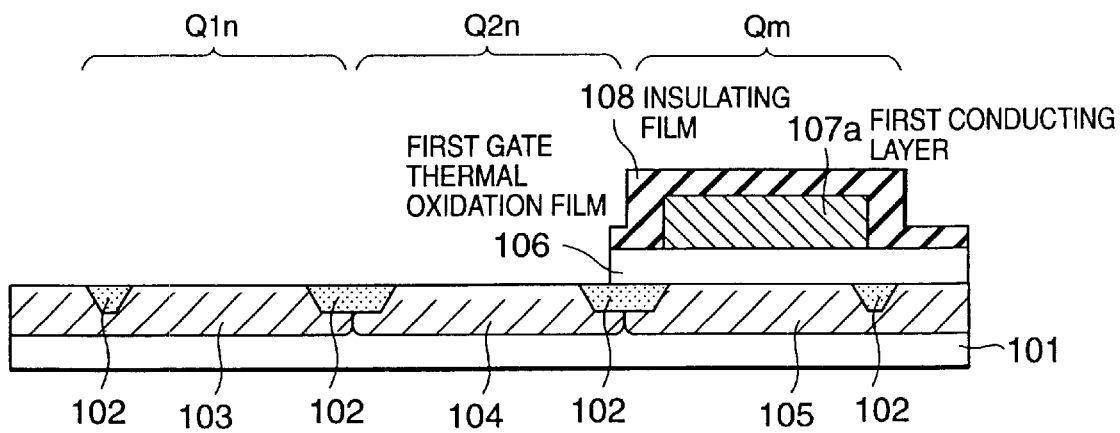
FIG. 30 is a cross-sectional view showing a manufacturing step following the manufacturing step of FIG. 29.
Figure 31:
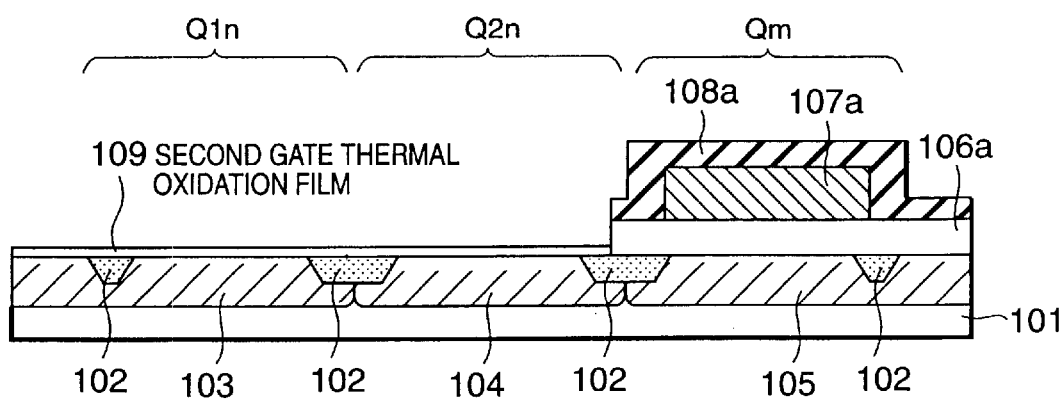
FIG. 31 is a cross-sectional view showing a manufacturing step following the manufacturing step of FIG. 30.
Figure 32:
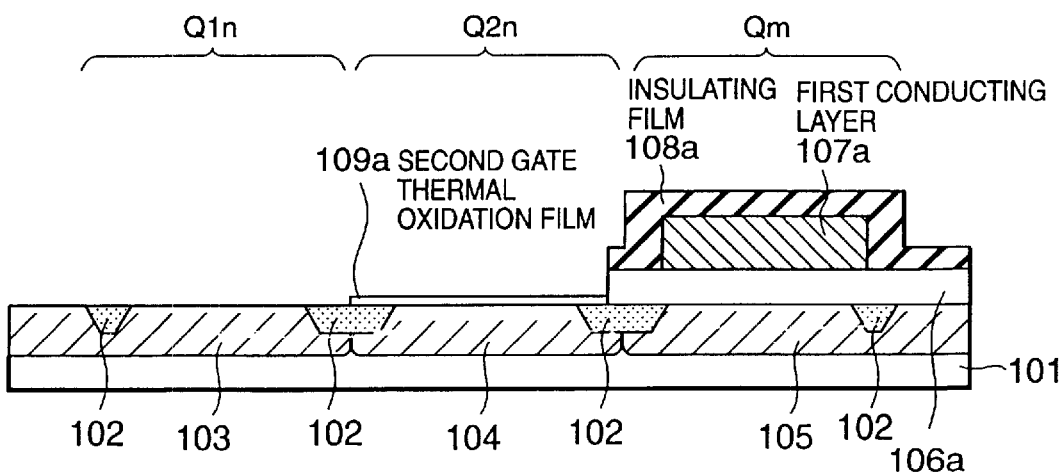
FIG. 32 is a cross-sectional view showing a manufacturing step following the manufacturing step of FIG. 31.
Figure 33:
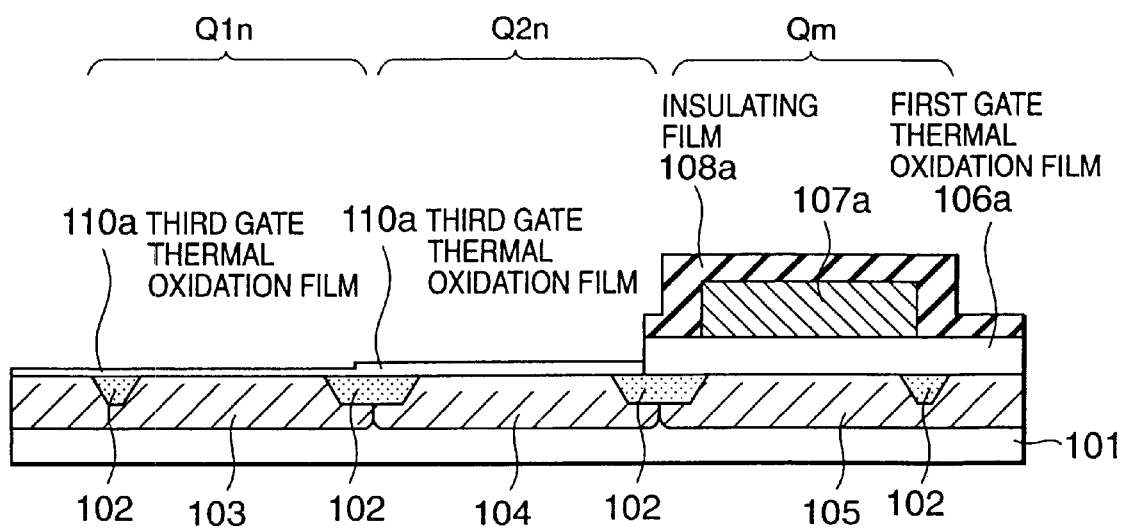
FIG. 33 is a cross-sectional view showing a manufacturing step following the manufacturing step of FIG. 32.
Figure 34:
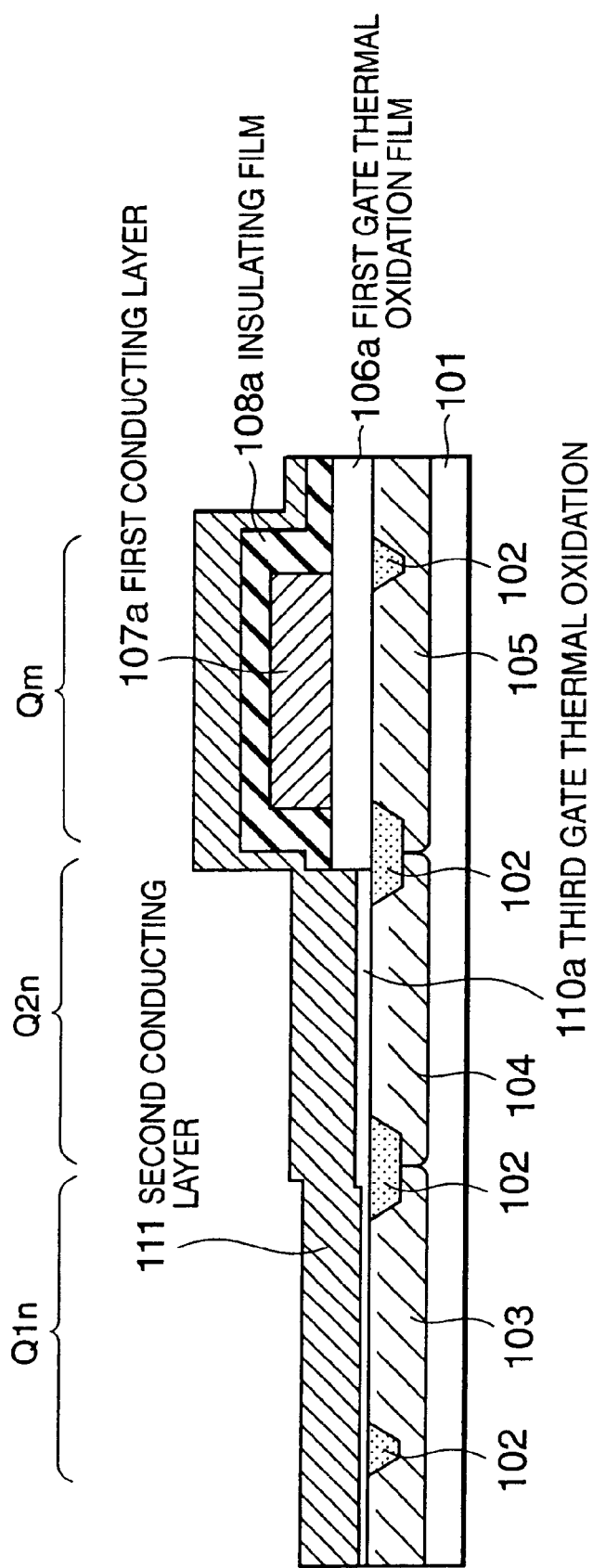
FIG. 34 is a cross-sectional view showing a manufacturing step following the manufacturing step of FIG. 33.
Figure 35:
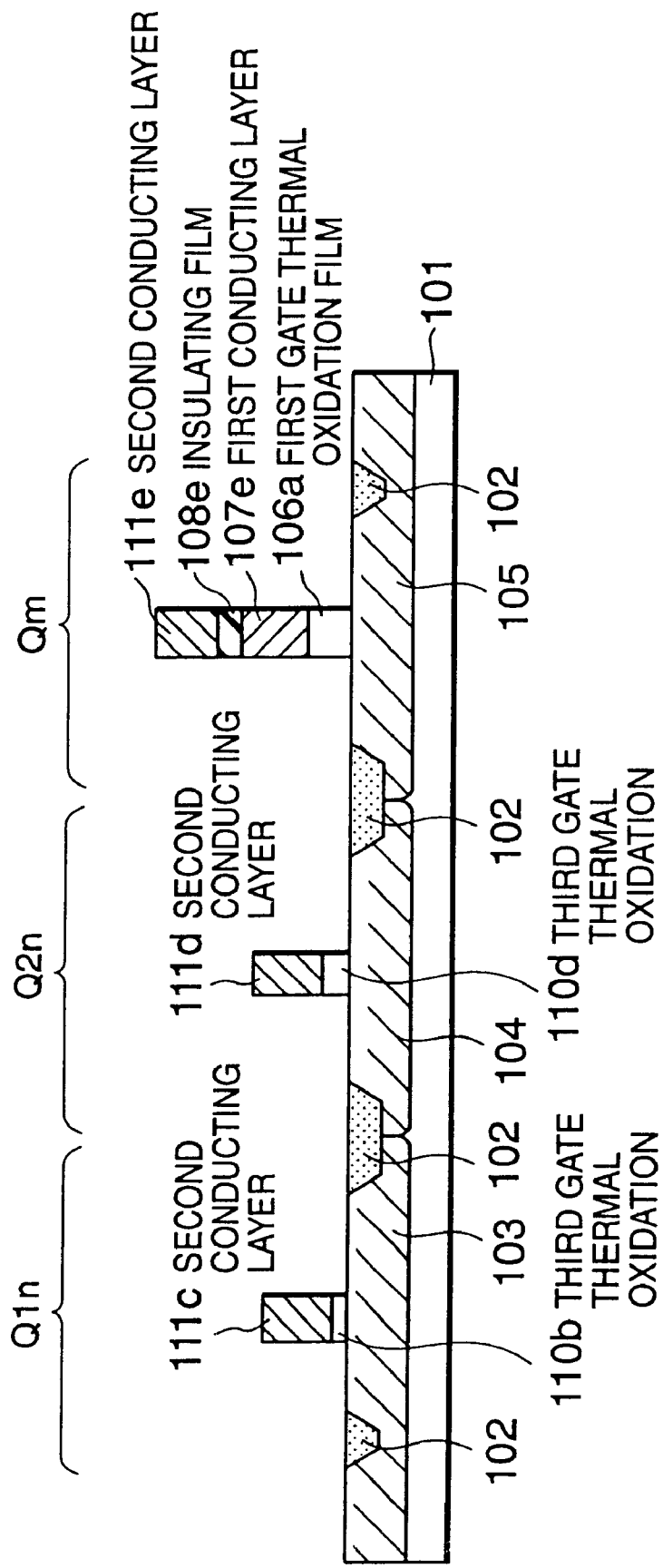
FIG. 35 is a cross-sectional view showing a manufacturing step following the manufacturing step of FIG. 34.
Figure 36:
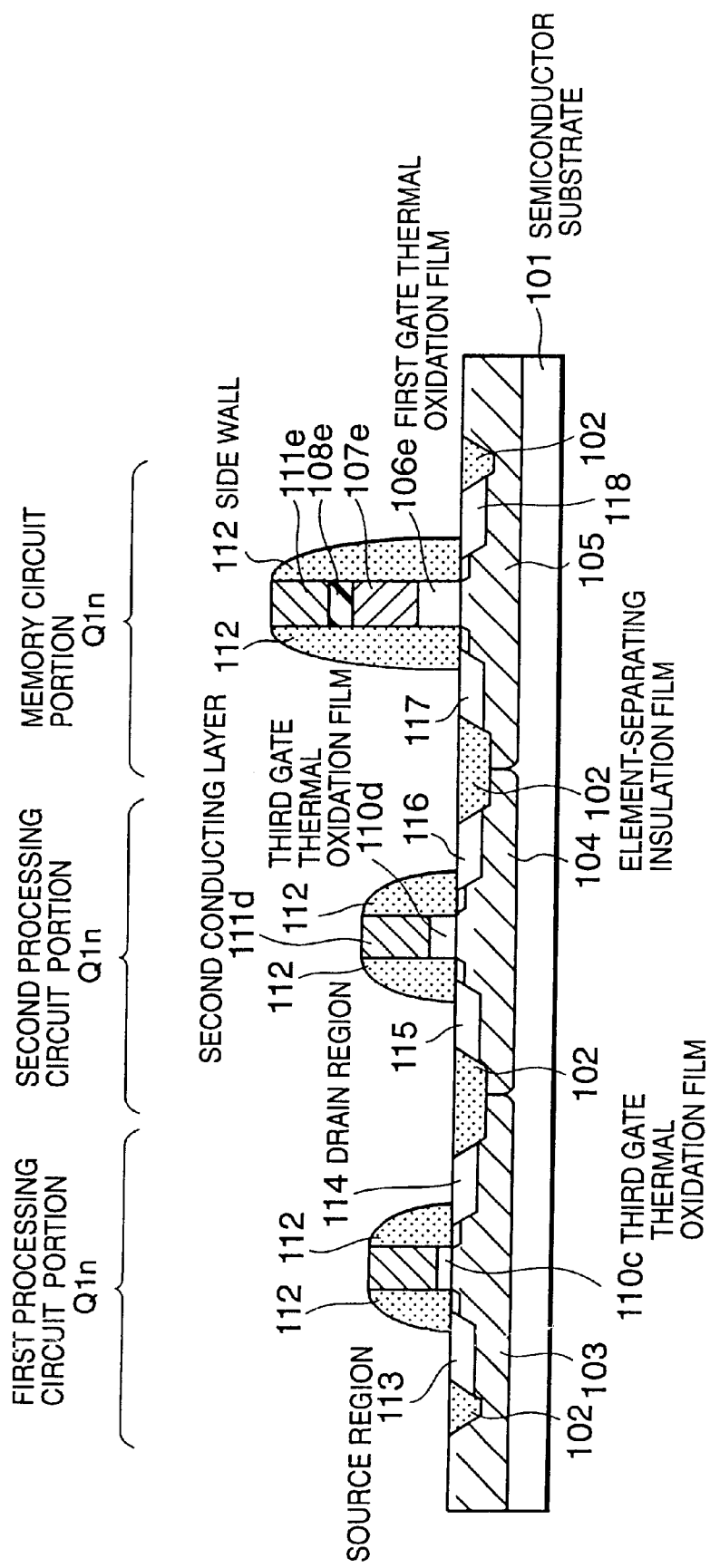
FIG. 36 is a cross-sectional view showing a manufacturing step following the manufacturing step of FIG. 35.

Next, as shown in FIG. 24, the second gate thermal oxide film 7c is patterned into a gate thermal oxide film 7e; the second gate thermal oxide film 7h into a gate thermal oxide film 7n; the second gate thermal oxide film 7d into a gate thermal oxide film 7f; the first conducting layer 8c into a first conducting layer 8e; the first conducting layer 8h into a first conducting layer 8n; the first conducting layer 8d into a first conducting layer 8f; the insulating film 9d into an insulating film 9f; the third gate thermal oxide film 10 into a third gate thermal oxide film 10a; the second conducting layer 11b into a second conducting layer 11a; and the second conducting layer 11d into a second conducting layer 11f; such that the resultantly obtained films have predetermined shapes, respectively.

The third gate thermal oxide film 10a and second conducting layer 11a constitute a gate thermal oxide film and a gate electrode of the first processing circuit portion Q1n, respectively. The gate thermal oxide film 7e and first conducting layer 8e constitute a gate thermal oxide film and a gate electrode of the second processing circuit portion Q2n, respectively. The gate thermal oxide film 7f and first conducting layer 8f constitute a gate thermal oxide film and a lower gate electrode of the memory circuit portion Qm, respectively. The insulating film 9f constitutes an insulating film separating an upper gate electrode and the lower gate electrode of the memory circuit portion Qm, and the second conducting layer 11f constitutes the upper gate electrode of the memory circuit portion Qm. Further, the gate thermal oxide film 7n and first conducting layer 8n constitute a gate thermal oxide film and a gate electrode of the N-th processing circuit portion QNn, respectively.

Next, as shown in FIG. 12, there are formed side walls 12 along the side surfaces of the second gate thermal oxide film 7e, second gate thermal oxide film 7n, second gate thermal oxide film 7f, first conducting layer 8e, first conducting layer 8n, first conducting layer 8f, insulating film 9f, third gate thermal oxide film 10a, second conducting layer ha and second conducting layer 11f, respectively. The side walls 12 can be formed such as by growing an insulating film (silicon oxide film, silicon nitride film, for example) by a CVD method, and by conducting anisotropic etching by a RIE method. Further, there are formed the source region 13 and drain region 14 by introducing n-type impurities into the first processing circuit portion Q1n. There is adopted arsenic as the n-type impurities, for example. Similarly, there are formed the source region 15 and drain region 16, by introducing n-type impurities into the second processing circuit portion Q2n. Further, there are formed the source region 17 and drain region 18, by introducing n-type impurities into the memory circuit portion Qm. Moreover, there are formed the source region 19 and drain region 20, by introducing n-type impurities into the N-th processing circuit portion QNn.

According to the manufacturing method shown in FIGS. 12 through 24, it becomes possible render the N-th processing circuit to be formed with the third gate thermal oxide film having a thickness fully different from those of the gate thermal oxide films of the first processing circuit portion and second processing circuit portion, while allowing both of the gate thermal oxide films of the first processing circuit portion and second processing circuit portion to have thicknesses exceeding 10 angstroms, and limiting the thickness difference therebetween to 10 angstroms or less.

In the second embodiment, it is possible to eliminate the N-th gate thermal oxide film 6'c shown in FIG. 15 and the first gate thermal oxide film 6a shown in FIG. 17, upon patterning.

Further, it is possible to change the forming order of the source region 13 and drain region 14, the source region 15 and drain region 16, the source region 17 and drain region 18, and the source region 19 and drain region 20 shown in FIG. 12.

Further, it is possible to realize a gate thermal oxide film of an additional processing circuit, by repeating the process for growing the N-th gate thermal oxide film 6' over the entire surface of the semiconductor substrate 1 as shown in FIG. 14, and the process for patterning the N-th gate thermal oxide film 6' into the N-th gate thermal oxide film 6'e as shown in FIG. 15. Meanwhile, in case that the film thickness of the N-th processing circuit is the same as that of the memory device, such a gate thermal oxide film can be achieved by omitting the process for growing the N-th gate thermal oxide film 6' over the entire surface of the semiconductor substrate 1 as shown in FIG. 14 and the process for patterning the N-th gate thermal oxide film 6' into the N-th gate thermal oxide film 6'e as shown in FIG. 15.

In the second embodiment, the N-th processing circuit QNn has been constituted of an n-channel type MOS-transistor. However, this may be provided as an N-th processing circuit QNp of a p-channel type MOS-transistor. In this case, the p-type well region 5n shown in FIG. 13 shall be replaced by an n-type well region, and the source region 19 and drain region 20 shown in FIG. 12 shall be introduced with p-type impurities.

It is also possible to simultaneously incorporate the N-th processing circuit QNn as an n-channel type MOS-transistor and the N-th processing circuit QNp as a p-channel type MOS-transistor. In this case, it is possible to form a source region and a drain region of the first processing circuit portion (Q1p) of the p-channel type MOS-transistor, by forming an n-type well region in the element forming region for the N-th processing circuit QNp of the p-channel type MOS-transistor separately from the p-type well region 5n shown in FIG. 13, and by introducing p-type impurities into the N-th processing circuit portion QNp of the p-channel type MOS-transistor by a process different from that for the source region 19 and drain region 20 shown in FIG. 12.

The above embodiment has been described, assuming that the gate thermal oxide film for the N-th processing circuit is thicker than the gate thermal oxide film for the memory device. However, the gate thermal oxide film for the memory device may be thicker than the gate thermal oxide film of the N-th processing circuit. In this case, the N-th gate thermal oxide film 6'e shown in FIG. 15 may be patterned to be left in the element region portion of the memory device Qm.

There will be now described a third embodiment of the present invention. This embodiment is provided to improve the performance of the p-channel type MOS-transistor in the aforementioned embodiment.

Generally, those impurities, which are introduced into the first processing circuit portion Q1n upon forming the source region 13 and drain region 14 shown in FIG. 1 and FIG. 12, are also introduced into the gate electrode. Moreover, these impurities are brought into a stable state (i.e., activated), by heating the impurities. However, those p-type impurities to be inevitably introduced into a gate electrode in manufacturing a p-channel type MOS-transistor are forced to be diffused through a gate thermal oxide film into a semiconductor substrate direction upon activation (this phenomenon is called "impurity penetration"), thereby resulting in considerably deteriorated performance of the p-channel type MOS-transistor. It is known to thicken the gate thermal oxide film, as a countermeasure for preventing such impurity penetration. However, thickening a gate thermal oxide film increases the film thickness difference between circuit portions, thereby failing to satisfy the aforementioned requirement to limit the film thickness difference to 10 angstroms or less.

Nonetheless, it becomes possible to obtain a gate thermal oxide film of a desired film thickness without causing impurity penetration in each of the aforementioned embodiments, by adopting an n-channel type MOS-transistor as the first processing circuit portion and by adopting a p-channel type MOS-transistor as the second processing circuit portion.

According to the above described manufacturing method of a semiconductor device of the present invention, there are formed the first processing circuit portion and the second processing circuit portion on the single semiconductor substrate such that the gate oxide films of both processing circuit portions are 10 angstroms or more while the thickness difference between the gate oxide films of the first and second processing circuit portions is 10 angstroms or less. This allows to obtain a semiconductor formed with gate oxide films of desired thicknesses for the respective processing circuit portions, to thereby reduce production variance of semiconductor elements, thereby preventing deterioration of performance of MOS-transistors.

Further, according to the manufacturing method of a semiconductor device of the present invention, there is formed a first gate oxide film on a semiconductor substrate, followed by removal of the first gate oxide film in a region of a first processing circuit portion, and then the region is formed with a second gate oxide film having a thickness different from the thickness of the first gate oxide film. This allows to obtain a semiconductor formed with gate oxide films of desired thicknesses for the respective processing circuit portions, to thereby reduce production variance of semiconductor elements, and to thereby prevent deterioration of performance of MOS-transistors.

Although the invention has been described with reference to specific embodiments, this description is not meant to be construed in a limiting sense. Various modifications of the disclosed embodiments will become apparent to persons skilled in the art upon reference to he description of the invention. It is therefore contemplated that the appended claims will cover any modifications or embodiments as fall within the true scope of the invention.

What is claimed is:

1. A manufacturing method of a semiconductor device having a single semiconductor substrate, for forming a first processing circuit portion and a second processing circuit portion having mutually different thicknesses of gate oxide films on the single semiconductor substrate, the method comprising the steps of:

forming a first gate oxide film over said semiconductor substrate;

sequentially forming an insulating film and a first conducting layer over the entire surface of said first gate oxide film;

eliminating those portions ranging from said first gate oxide film to said first conducting layer, which portions are included within an element forming region of said first processing circuit portion; and forming, only in said element forming region of said first processing circuit portion, a second gate oxide film having a thickness different from that of said first gate oxide film.

2. A manufacturing method of a semiconductor device of claim 1, wherein said first processing circuit portion is to work in operation and said second processing circuit portion is to work on stand-by.

3. A manufacturing method of a semiconductor device of claim 1, further comprising the step of:

forming a memory circuit portion or other circuits, concurrently with said steps for forming said first processing circuit portion or said second processing circuit portion.

4. A manufacturing method of a semiconductor device of claim 3, wherein said memory circuit portion is formed to include a gate oxide film having a thickness different from that of said first gate oxide film of said second processing circuit portion.

5. A manufacturing method of a semiconductor device of claim 3, wherein an upper-gate-electrode aimed conducting layer or a lower-gate-electrode aimed conducting layer of said memory circuit portion id provided, simultaneously with and in the same step as, a gate-electrode aimed conducting layer of said first processing circuit portion or of said second processing circuit portion.

* * * * *